(12) United States Patent  
Butler

(10) Patent No.: US 8,582,263 B2
(45) Date of Patent: Nov. 12, 2013

(54) DIGITALLY CONTROLLED AC PROTECTION AND ATTENUATION CIRCUIT

(75) Inventor: Joel Butler, Springfield, MO (US)

(73) Assignee: Intrinsic Audio Solutions, Inc., Ozark, MO (US)

( * ) Notice: Subject to any disclaimer, the term of this patent is extended or adjusted under 35 U.S.C. 154(b) by 278 days.

(21) Appl. No.: 12/908,773

(22) Filed: Oct. 20, 2010

(65) Prior Publication Data

US 2011/0090604 A1    Apr. 21, 2011

Related U.S. Application Data

(60) Provisional application No. 61/253,157, filed on Oct. 20, 2009.

(51) Int. Cl.
*H02H 9/08* (2006.01)
(52) U.S. Cl.
USPC .......................................... 361/91.1; 361/93.9
(58) Field of Classification Search
USPC ................. 361/18, 91.1, 93.7, 93.9, 103, 111
See application file for complete search history.

(56) References Cited

U.S. PATENT DOCUMENTS

| | | | |
|---|---|---|---|
| 4,724,396 A | 2/1988 | Taylor, Jr. et al. | |
| 5,045,774 A | 9/1991 | Bromberg | |
| 5,767,744 A * | 6/1998 | Irwin et al. | 330/297 |
| 6,055,167 A * | 4/2000 | Shamkovich et al. | 363/52 |
| 7,339,427 B2 | 3/2008 | MacPhail | |
| 7,449,946 B1 * | 11/2008 | Hoover | 330/149 |
| 2002/0097090 A1 | 7/2002 | Smedegaard-Pedersen et al. | |
| 2006/0202636 A1 * | 9/2006 | Schneider | 315/291 |
| 2009/0001948 A1 * | 1/2009 | Martinez et al. | 323/271 |
| 2009/0251060 A1 * | 10/2009 | Henze | 315/246 |

* cited by examiner

*Primary Examiner* — Danny Nguyen
(74) *Attorney, Agent, or Firm* — Bell Nunnally & Martin LLP; Craig J. Cox

(57) ABSTRACT

A protection and attenuation circuit for sensitive AC loads is described. The circuit provides AC power protection and attenuation utilizing high-efficiency switch-mode techniques to attenuate an AC power signal by incorporating a bidirectional, transistorized switch driven from a pulse width modulation signal, PWM. The circuit monitors characteristics of the AC power signal driving a known load and characteristics of the load or other elements and determines the duty cycle of the pulse width modulated signal, PWM, based upon the duration and amplitude of the over-voltage, over-current, over-limit or other event.

27 Claims, 19 Drawing Sheets

TYPICAL LOUDSPEAKER POWER HANDLING PERFORMANCE

TYPICAL LOUDSPEAKER POWER HANDLING PERFORMANCE
OVERLAID WITH SELF-ACTUATING, SELF-ATTENUATING LAMP

TYPICAL LOUDSPEAKER POWER HANDLING PERFORMANCE
OVERLAID WITH A SELF-ACTUATING, SELF-ATTENUATING
THERMISTOR (PTC)

TYPICAL LOUDSPEAKER POWER HANDLING PERFORMANCE
OVERLAID WITH A DIRECT DRIVE RELAY (LAMP ATTENUATOR)

TYPICAL LOUDSPEAKER POWER HANDLING PERFORMANCE
OVERLAID WITH A TWO ACTUATOR, SINGLE ATTENUATOR
(LAMP) PROTECTIVE NETWORK

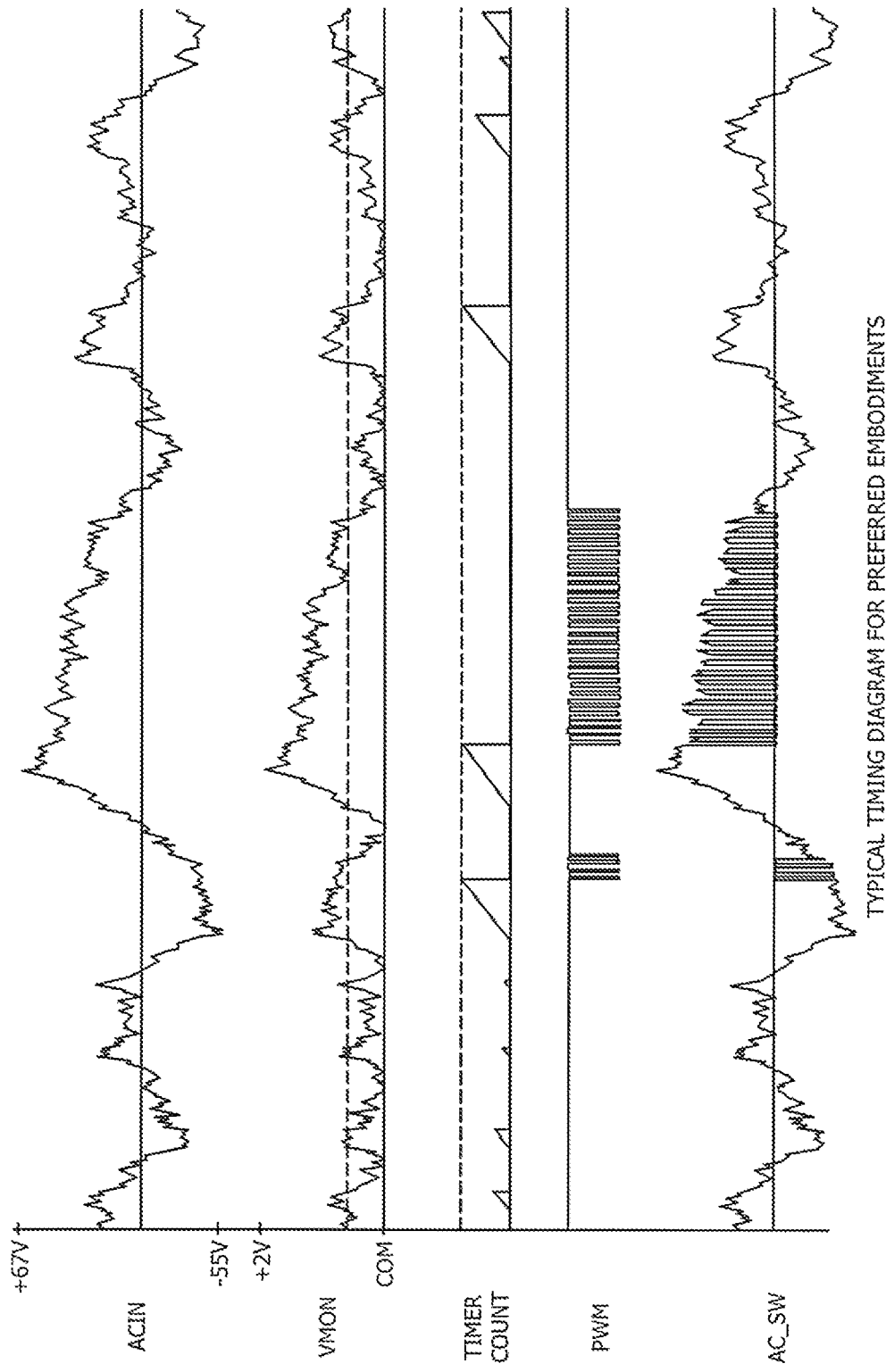
FIG. 7  TYPICAL TIMING DIAGRAM FOR PREFERRED EMBODIMENTS

TYPICAL LOUDSPEAKER POWER HANDLING PERFORMANCE OVERLAID WITH A FIRST EMBODIMENT (DEPLETION FET WITHOUT RELAY BYPASS)

TYPICAL LOUDSPEAKER POWER HANDLING PERFORMANCE OVERLAID WITH A SECOND EMBODIMENT (ENHANCEMENT FET WITH RELAY BYPASS)

DIGITALLY CONTROLLED AC PROTECTION AND ATTENUATION CIRCUIT

CROSS REFERENCE TO RELATED INFORMATION

This application claims the benefit of U.S. Provisional Patent Application No. 61/253,157, filed Oct. 20, 2009, titled "Digital Attenuation and Protection Circuit" the entire contents of which are hereby incorporated by reference.

TECHNICAL FIELD

The present disclosure is directed to protection and attenuation circuitry for sensitive loads. More particularly, the present invention relates to a low-cost, high-efficiency, digitally controlled AC protection & attenuation circuit optimized for applications designed to protect sensitive AC loads.

BACKGROUND OF THE INVENTION

It is often desirable to protect sensitive loads from excessive AC voltage, current, frequency, temperature, mechanical limit, or other conditions which may lead to permanent damage to the load, especially when regularly operating at or near the rated load voltage or current. It is also desirable to allow permissible AC voltages and currents to pass to the load without significant attenuation, distortion, or filtration. Due to the variety of loads driven from AC sources, voltage and current protection limits vary significantly, thereby requiring protective circuitry that can support many different trip thresholds. A loudspeaker represents a sensitive load that regularly operates at or near its rated AC power and presents challenges to the art of AC power protection, due to the fact that loudspeaker transducers typically can handle large power levels for a short duration and reduced power levels for longer durations. In other words, the time duration of the overage is critical to monitor for protective purposes; power limiting too soon will not allow full utilization of the transducer, while power limiting too late will result in permanent damage to the transducer. Additionally, these time duration coefficients change with the transducer temperature and environmental conditions. Protecting sensitive loads from excessive AC power can be a difficult task and many existing techniques have failed to adequately protect the load from all overage conditions while allowing permissible voltages and currents to pass unaltered.

In addition to AC protection, there are other situations where it is desirable to continuously attenuate an AC voltage that is powering a known load, such as reducing the level of an AC signal powering a loudspeaker. Some loudspeaker applications require AC power attenuation to control the output level of the loudspeaker. For example, consider a simple audio system consisting of four loudspeakers connected in a parallel wiring configuration. Situations may arise where reducing the level of one of the four loudspeakers is desirable. This may be a distributed multi-zoned application or a line array application where several elements within an array need to be turned down. Unfortunately, attenuating these high power signals has been costly, inefficient, and resulted in signal degradation. Another application for continuous AC attenuation is within lighting dimmers. Existing AC attenuators used for lighting applications have focused on attenuation of standard line voltage sinusoids, i.e. 120-240VAC at 50-60 Hz, with no effort to address complex signals spanning the entire audio bandwidth, 20 Hz to 20 kHz. Furthermore, AC dimmers have not made efforts to incorporate protective monitoring circuitry, leaving the lamp or load unprotected against AC overage conditions.

Existing circuits designed to protect sensitive loads from AC power overages have generally used a combination of actuating devices and attenuating devices. Actuating devices have been incorporated to actuate, or change electrical conductive state, during over-voltage or over-current conditions, while attenuating devices have been used to attenuate, or reduce the unwanted voltage or current. Some devices are self-actuating and attenuating devices due to their inherent ability to actuate, or change electrical states when certain conditions have been met, as well as introduce an attenuation once actuated. An example of a self-actuating and attenuating device is a Transient Voltage Suppression diode (TVS, comparable to a large zener diode), which can be used to self-commutate, or actuate, and effectively clamp the voltage at a pre-determined threshold by shunting excess current to ground or neutral. Bi-directional TVS diodes have been specifically developed for use within AC or bi-polar DC systems. A Metal Oxide Varistor (commonly referred to as a MOV) is another commonly used self-actuating and attenuating device that operates similarly to a bi-directional TVS diode. Unfortunately, self-actuating devices such as TVS diodes, MOVs, thermistors, etc. are not adjustable and actuation thresholds can vary significantly depending on ambient temperature and/or production tolerances. Another actuating and attenuating device commonly found in loudspeaker transducer protection circuitry is a lamp. Typically employed in a series configuration, as shown in FIG. 2B, a lamp is considered self-actuating in that the filament will not heat (burn) until enough current is flowing. Yet, once an adequate current is established, the filament lights and its impedance increases, thus allowing power attenuation/dissipation in the form of light and heat. Unfortunately, lamps also have several deficiencies such as filament damage, insertion loss, nominal maximum impedance, light output, and excessive heat generation.

Other protection designs have opted for devices that operate solely as actuators or circuit interrupters due to their ability to introduce an open circuit condition when tripped. The most common self-actuating, circuit interruptive device is a fuse, wherein a specially sized and formed conductor is designed to burn away in the presence of an over-current scenario. Fuses are relatively inexpensive and somewhat effective; however, they are designed with fixed trip thresholds, they have predetermined response times, and once blown, are permanently destroyed, i.e. they must be physically replaced. For most sensitive load applications, fuses are not acceptable due to excessive response time wherein the load may sustain permanent damage. Specialized Positive Temperature Coefficient thermistors (PTCs) have been developed to address the permanent destruction issue common to fuses or fusible links, but they fail to solve the fixed threshold and response time problems. Other actuating devices, such as relays, are considered controlled actuating devices because they require triggering circuitry to control the actuation. Controlled actuation is desirable due to the ability to easily change or program the voltage or current thresholds that result in actuation, but many of the electromechanical actuators, such as relays, suffer from limited response time. For example, a standard power relay has a typical turn-on time of approximately five milliseconds, and in some scenarios, this lag in actuation can result in damage to a sensitive load. Another important aspect of controlled actuation is the circuitry used to control or trigger the actuator. In the art of loudspeaker protection, the circuitry controlling the actuator/s has been implemented with non-programmable components, such as resistors, capacitors, and zener diodes; no effort has been made to utilize a microprocessor based device for actuation control. While non-programmable actuation control circuits are effective, they do not allow threshold and time coefficient adjustment without changing circuit component values (resistors and capacitors). This implementation fundamentally requires differing control circuits for each desired combination of trip thresholds and time coefficients.

AC power attenuation has been another key aspect of implementing high-performance protection circuits for sensitive loads. Once the actuation device has tripped, an attenuating device can be used to reduce the AC power to a safe level. Previous designs have incorporated power attenuators that dissipate unwanted power in the form of heat and in some cases light energy as well. Attenuating devices can be grouped as variable attenuators or fixed attenuators. A resistor with constant impedance would be considered a fixed attenuator, while a lamp with filament heat-dependant impedance would be considered a limited-range variable attenuator. A common device employed for AC power attenuation has been the resistor. Power resistors come in many different shapes, sizes, and constructions (thick film, wire-wound, etc.) and typically have been packaged within cases that allow significant thermal dissipation. While resistive attenuation has achieved the desired result, the drawbacks are significant. Excessive power dissipation requires large, costly resistors, and in some cases specialized heat sinks and/or liquid cooled apparatus are required to dissipate the thermal energy. In the art of loudspeaker protection and attenuation, resistors and lamps are the two most common devices for high power attenuation; no attempts have been made to use transistorized, programmable attenuators.

Existing circuits designed to continuously attenuate an AC power signal driving a loudspeaker, such as circuits designed to lower the amplitude of a signal in a distributed or line array system, have taken one of two approaches: resistive attenuation or transformer voltage step-down. Unfortunately, these existing techniques of continuously attenuating or stepping-down the AC power signal suffer from several significant problems. Circuitry designed to attenuate an AC power signal using resistive attenuation suffers from excessive power loss, thereby requiring large, high-power resistive elements that produce significant heat and can be costly. Alternatively, approaches using the transformer step-down approach benefit from much lower loss (typically 1-2 dB insertion loss), but introduce the following drawbacks to the system: (1) significant physical size and weight due to low frequency magnetic core, (2) frequency response degradation (low frequencies are rolled off), (3) costly as power increases, (4) transformer core saturation problems limit the effective usefulness to low power applications (typically 100 W or less), (5) fixed number of secondary windings "taps" (typically 4) does not allow fine amplitude control. These problems have been prevalent for decades, and no improved solution has been established in situations where continuous attenuation is required.

To illustrate the deficiencies found in many of the existing AC power protection circuits, several examples are presented, wherein the load is a sensitive inductive load, a loudspeaker, having dynamic power handling characteristics that change with duration and overage. Referring to FIG. 1, two aspects of a typical loudspeaker power handling performance are presented; required attenuation and time duration. Typical loudspeakers have a rated power handling specification, below which the transducer will operate without damage illustrated by the dotted line, 44. The left axis, 40, corresponds to an attenuation value in decibels (dB). The solid line, 42, represents the loudspeakers required attenuation to sustain proper operation without damage. The right vertical axis, 46, corresponds to time in seconds (sec). The dashed line, 48, represents the loudspeakers power handling as a function of time duration in seconds. The common horizontal axis, 50, represents increasing power. As evident in FIG. 1A, the transducer requires increasing attenuation as the input power level exceeds the rated power of the loudspeaker. Also, as the input power increases, the duration of time within which the transducer will operate without damage steadily decreases. Effective protection should seek to provide adequate attenuation above the rated power handling of the loudspeaker, and should control the duration of power levels in excess of the rating. Additionally, effective protection should seek to allow all power levels below the loudspeakers rating to pass unaltered, i.e. minimal attenuation, filtration, and distortion.

Referring to FIG. 2A, required attenuation and time duration plots of a typical loudspeaker are overlaid with a typical self-actuating, self-attenuating lamp. The lamp's attenuation is represented by the solid line, 52, and the time response of the lamp is represented by the dashed line 54. As evident in FIG. 2A, the lamp self-actuates and attenuates before the load's power handling rating, 44, and begins a linear increase in attenuation. Unfortunately, the lamps attenuation plateaus and is significantly less than what the load requires to maintain damage-free operation. Shaded region 56 illustrates the damage region in which the load would receive more power than the specified rating. The lamps time response is somewhat fast, as evident by dotted line 54, clearly faster than the initially required response time of the loudspeaker, 48. This initial excessive speed will clamp many safe transient power levels quicker than required. However, at extreme high power levels the lamp actuation and attenuation time lags behind the required response time of the loudspeaker, 48, which allows operation in the damage region, 58. Lamps also have a nominal impedance even when they are not actuated or lighting, which results in a measurable insertion loss. Finally, lamps have a maximum power rating at which the filament can be damaged upon over-powering the device, which greatly limits the operational power range of circuits that incorporate lamps without subsequent filament protection. A representative schematic of a single lamp, loudspeaker protection circuit is provided in FIG. 2B.

Referring to FIG. 2C, required attenuation and time duration plots of a typical loudspeaker transducer are overlaid with a typical self-actuating thermistor (usually a Positive Temperature Coefficient device, PTC). The PTC attenuation is represented by the solid line, 52, and the time response to reach the nominal attenuation is represented by the dashed line 54. As evident in FIG. 1B, the PTC actuates slightly before the load's power handling rating, 44, and steps quickly in attenuation. While the PTC does offer adequate attenuation, the fast-acting step attenuation response is not optimal, and when used for loudspeaker protection is easily detected by the human ear. The PTC time response is very slow, as evident by dotted line 54, and is clearly slower than the required response time of the load, 48. Shaded region 56 illustrates the damage region in which the load would receive longer power durations than the specified rating. Unfortunately, while selecting smaller PTC devices will speed the time response, the actuation threshold is typically much less than the desired power rating of the load. Additionally, PTC devices will remain actuated with a small amount of trickle current, leading to poor release and recovery performance. PTC actuation thresholds will also vary greatly depending upon the ambient temperature, greatly limiting the effective operational temperature range of circuits incorporating such devices. Because of these problems, designers have great difficulty finding a single PTC device that meets all of the desired requirements with respect to time, attenuation, actuation thresholds, and release performance. A representative schematic of a self-actuating PTC loudspeaker protection circuit is provided in FIG. 2D wherein PTC, 12, is bypassed with an optional fixed attenuator, 10.

Referring to FIG. 2E, required attenuation and time duration plots of a typical loudspeaker transducer are overlaid with a non-time delayed relay actuator and a single lamp attenuator. The attenuation characteristic, solid line 52, is the same as a single lamp; however, the lamp is not allowed to attenuate below the power rating of the load, 44. Unfortunately, the inadequate attenuation of the lamp at higher power levels remains a problem and allows operation in the damage region, 56. Due to the absence of a timing stage within the triggering circuit, the relay time response is somewhat fast, as evident by dotted line 54, clearly faster than the initially required response time of the loudspeaker, 48. This initial excessive speed will clamp many safe transient power levels quicker than required. However, at extreme high power levels the relay actuation time lags behind the required response time of the loudspeaker, 48, which allows operation in the damage region, 58. Typical electromechanical relays have a response time of 5 to 10 milliseconds, and sensitive loads may require protection less than a millisecond under these extreme high-power levels. The overall result for a non-time delayed relay circuit is a less than optimal protection topology for dynamic sensitive loads such as loudspeakers. Additionally, typical relay designs have suffered from actuation chatter wherein the relay actuates and releases rapidly when the input signal is crossing the relay coil threshold. Such chatter degrades the life of the relay contacts significantly. A representative schematic of a non-time delayed relay actuator and a single lamp attenuation circuit is provided in FIG. 2F, wherein the relay is controlled by a voltage-divided, non timed, rectified signal.

Referring to FIG. 2G, required attenuation and time duration plots of a typical loudspeaker transducer are overlaid with a time controlled, dual relay actuator, and a single lamp attenuator. The time response characteristic, line 54, is much improved over the non-timed approach presented in FIG. 2E. However, there remains a small region of damage susceptibility, 58, wherein the actuation lag is not fast enough to protect the loudspeaker from large transients. The attenuation characteristic, solid line 52, is the same as a single lamp; however, the lamp is not allowed to attenuate below the power rating of the load due to the first actuation stage threshold, line 44, and the lamp circuit is interrupted above the second actuation stage threshold, 60. The second actuator halts current flow to ensure adequate filament and load protection, but introduces excessive attenuation highlighted in the shaded region 62, wherein the load is effectively disconnected. A representative schematic of a time controlled, dual relay actuated, single lamp attenuation circuit is provided in FIG. 2H, wherein the relay is controlled by a detected, timed, rectified signal.

The final category of designs to consider are those that have incorporated circuit components, such as thyristors, metal oxide varistors, triacs and/or TVS diodes, configured to clamp over-voltage scenarios. Clamping devices are typically connected in parallel with the load allowing a current shunt to ground or neutral in the case of an overage condition. These devices, while very fast, have presented several problems to high-performance protection circuits: (1) excessive currents exist when clamping and can result in damage to the clamping device, the AC source, or passive line conditioning circuitry connected thereto; (2) clamping techniques result in non-linear loading on the AC driving device and are not acceptable for protection circuits that are required to connect to a variety of different AC sources; and (3) significant signal distortion is added when voltage clamping, or "clipping", is active. Due to these significant problems with clamping and crow-bar designs, no effort was made to present graphical plots of their performance.

Overall, it should be well understood that none of the existing state of the art techniques for protecting sensitive AC loads have incorporated high-efficiency, digitally programmable attenuation or microprocessor based control. All previous attempts have relied upon discrete control circuitry and lossy attenuators that have fixed inherent properties, i.e. lamp filaments, resistors, thermistors. Therefore, it should be stressed that the lack of digitally programmable attenuation and microprocessor based control were two fundamental deficiencies of prior art in AC power protection of sensitive loads.

In summary, existing AC power protection circuits have suffered from the following problems: non-programmable attenuation, lossy attenuators generating excessive heat and/or light output, non-programmable thresholds and timing coefficients, high insertion loss, abrupt stepped actuation, non-linear loading, inadequate peak voltage and current protection, limited operational power range, and actuation chatter. Additionally, existing circuits designed for continuous AC attenuation have suffered from excessive power dissipation (heat), cost, limited control, magnetic core saturation problems, frequency response anomalies, and no over-power protection monitoring.

BRIEF SUMMARY OF THE INVENTION

Embodiments of a protection and attenuation circuit according to the concepts described herein, overcome the above-identified as well as other problems and disadvantages in the art by providing a circuit operable to provide high-efficiency, digitally controlled, broadband, programmable attenuation, and programmable monitoring of power, current, voltage, frequency, mechanical limit or other conditions. Though not limited thereto, embodiments of the described circuits are ideal for sensitive loads, such as loudspeaker devices that require average and peak power protection. While the applicability to loudspeakers and other sensitive loads is described herein, the concepts and embodiments of the protection and attenuation circuits described herein can be applied to any load where protection and attenuation from over voltage, over current or other harmful situations is desirable. It should also be noted that embodiments of the present invention can be configured to derive all necessary operational power from an audio signal driving a loudspeaker, thereby not requiring a secondary power source. This is ideal for passive loudspeakers wherein no secondary power supply is available.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following descriptions taken in conjunction with the accompanying drawings, in which:

FIG. 7 is a timing diagram illustrating the operation of an exemplary embodiment of a protection and/or attenuation circuit according to the concepts described herein;

DETAILED DESCRIPTION OF THE INVENTION

Figure 1:
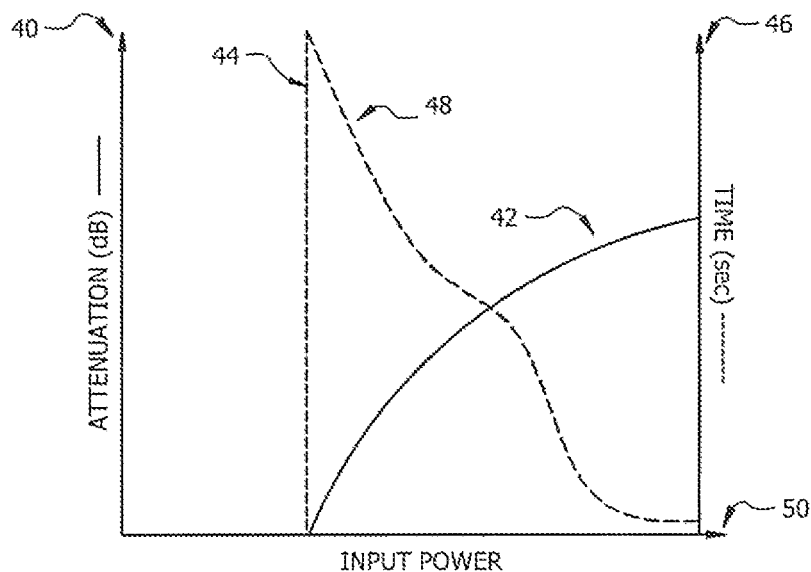
FIG. 1 is a plot of typical loudspeaker power handling characteristics.
Figure 2A:
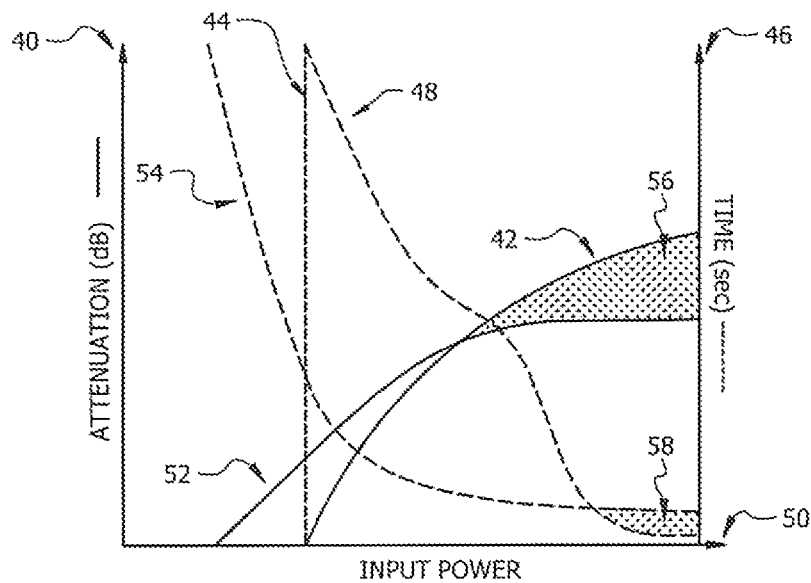
FIG. 2A is a plot of typical loudspeaker power handling characteristics overlaid with a typical self-actuating and attenuating lamp.
Figure 2B:
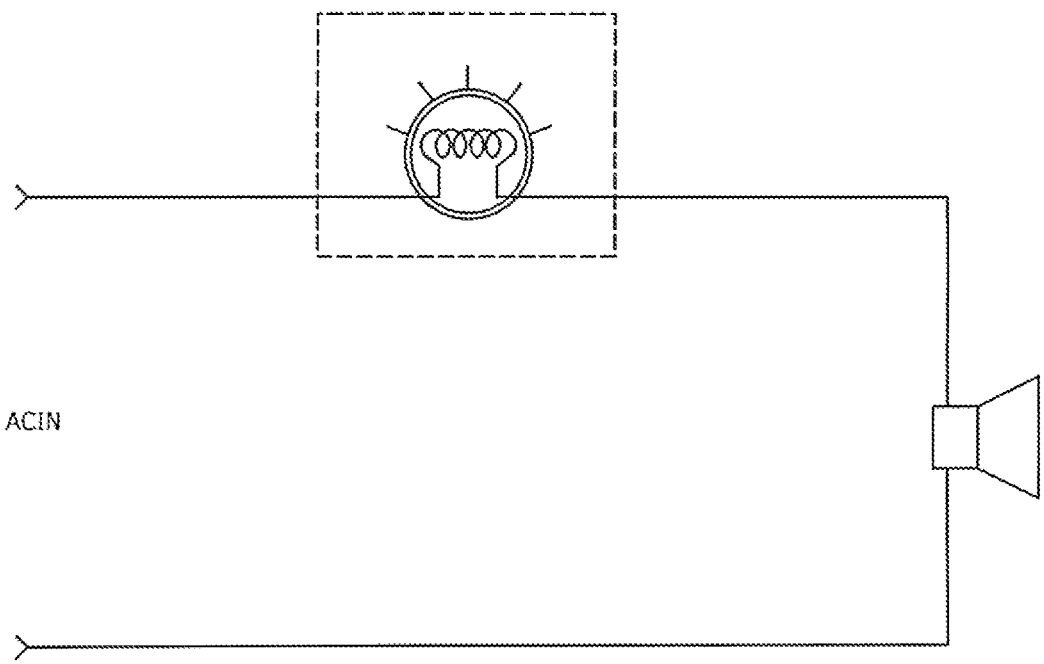
FIG. 2B is a schematic of a typical self-actuating and attenuating lamp protection circuit.
Figure 2C:
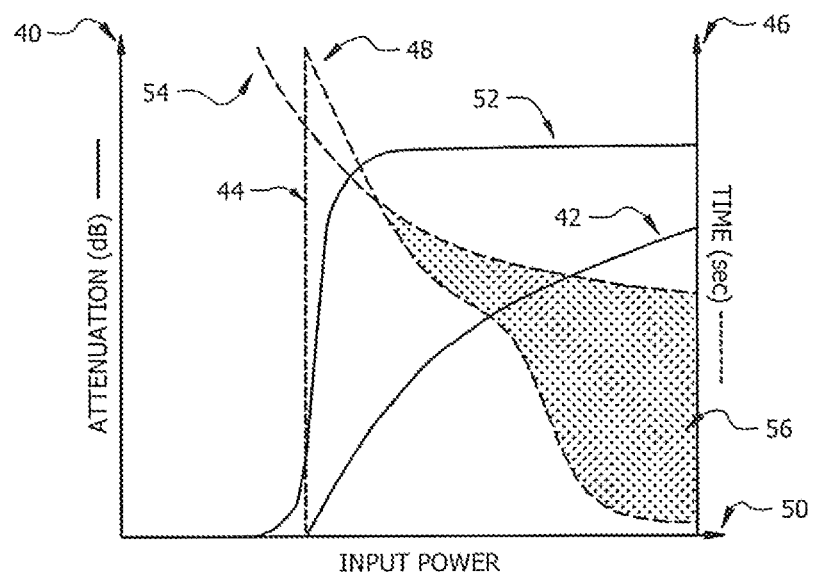
FIG. 2C is a plot of typical loudspeaker power handling characteristics overlaid with a typical self-actuating and attenuating thermistor (PTC)
Figure 2D:
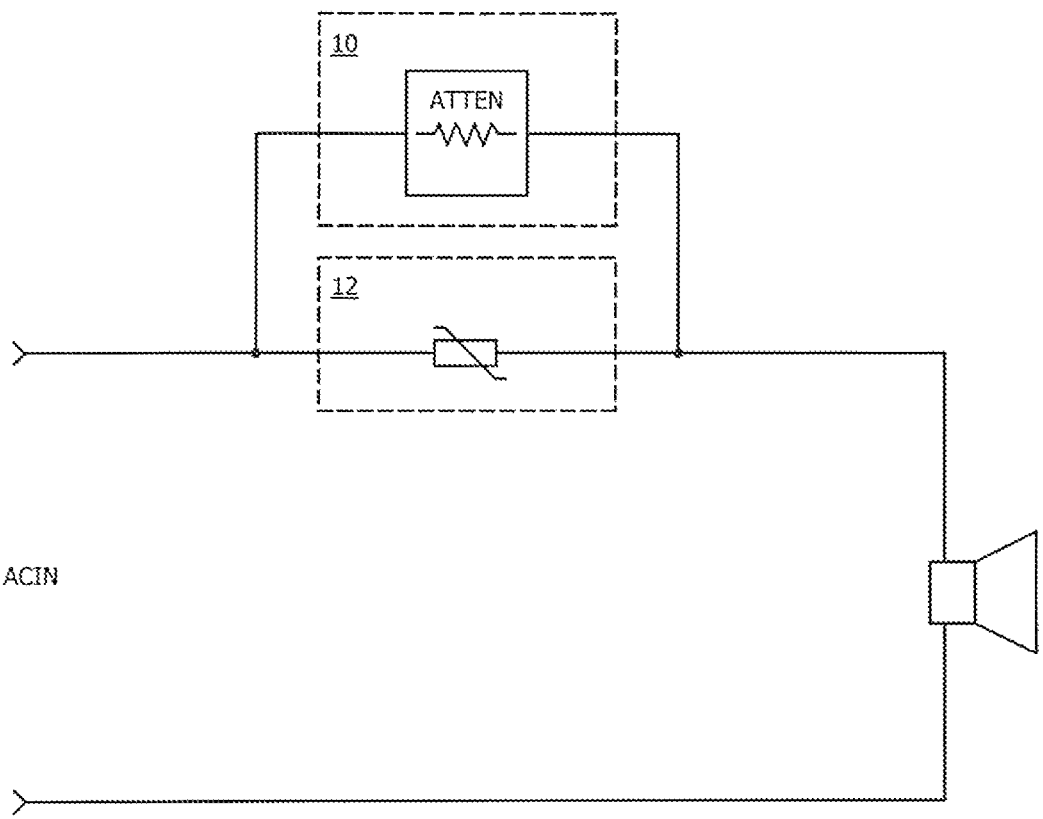
FIG. 2D is a schematic of a typical self-actuating and attenuating thermistor protection circuit.
Figure 2E:
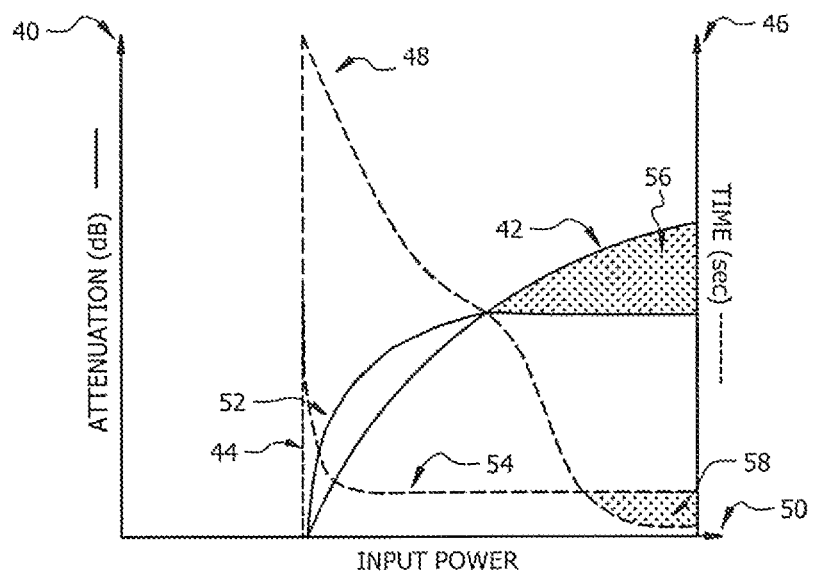
FIG. 2E is a plot of typical loudspeaker power handling characteristics overlaid with a typical non-timed, controlled-actuating relay with lamp attenuator.
Figure 2F:
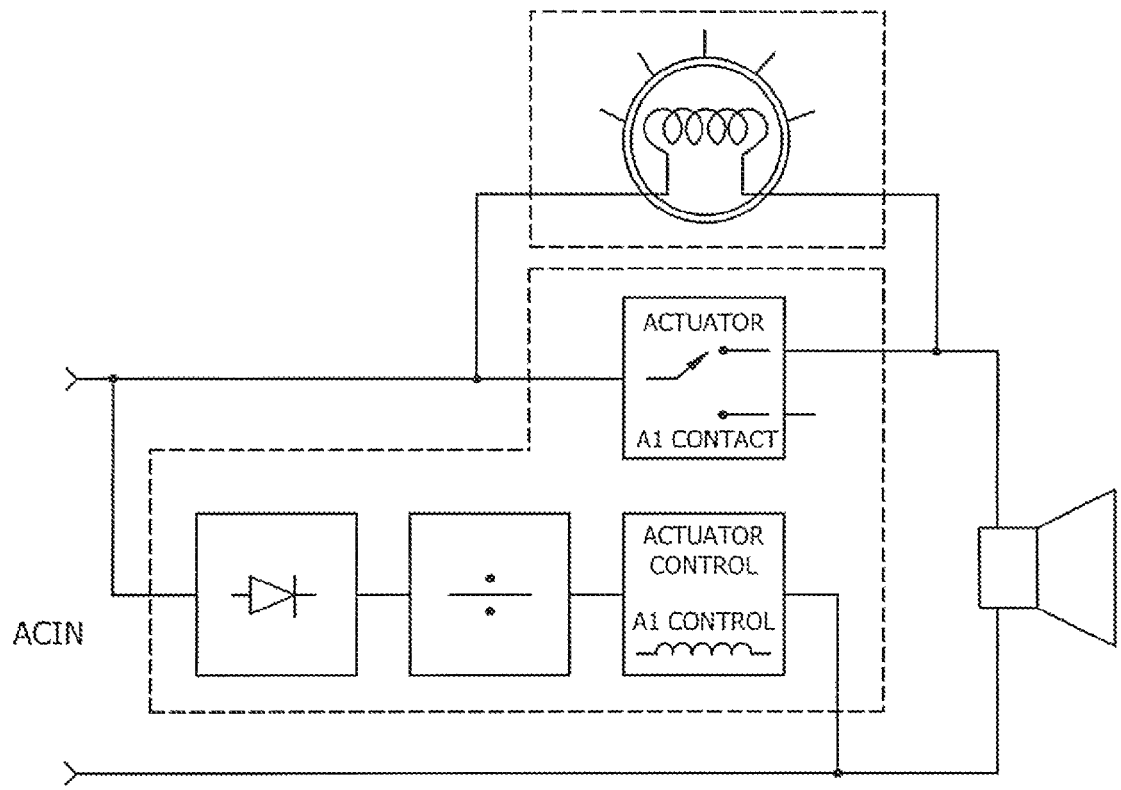
FIG. 2F is a schematic of a typical non-timed, single relay, lamp attenuator protection circuit.
Figure 2G:
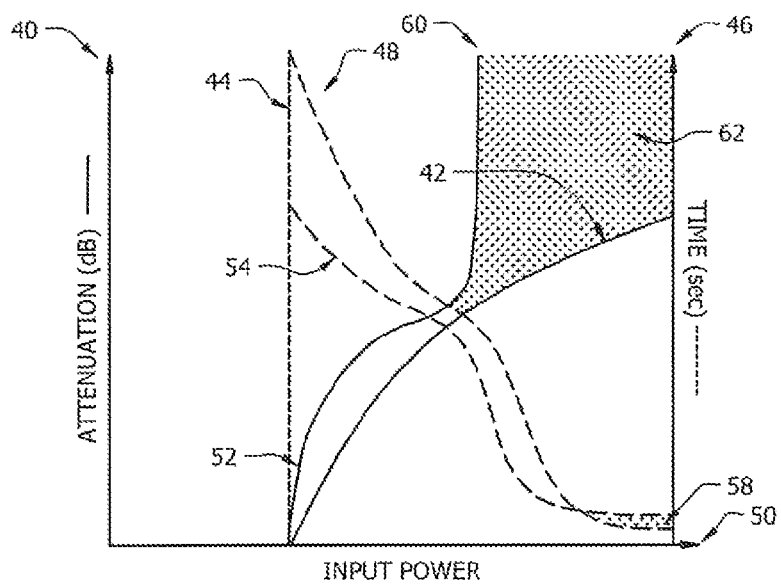
FIG. 2G is a plot of typical loudspeaker power handling characteristics overlaid with a typical timed & detected, dual relay and lamp attenuator.
Figure 2H:
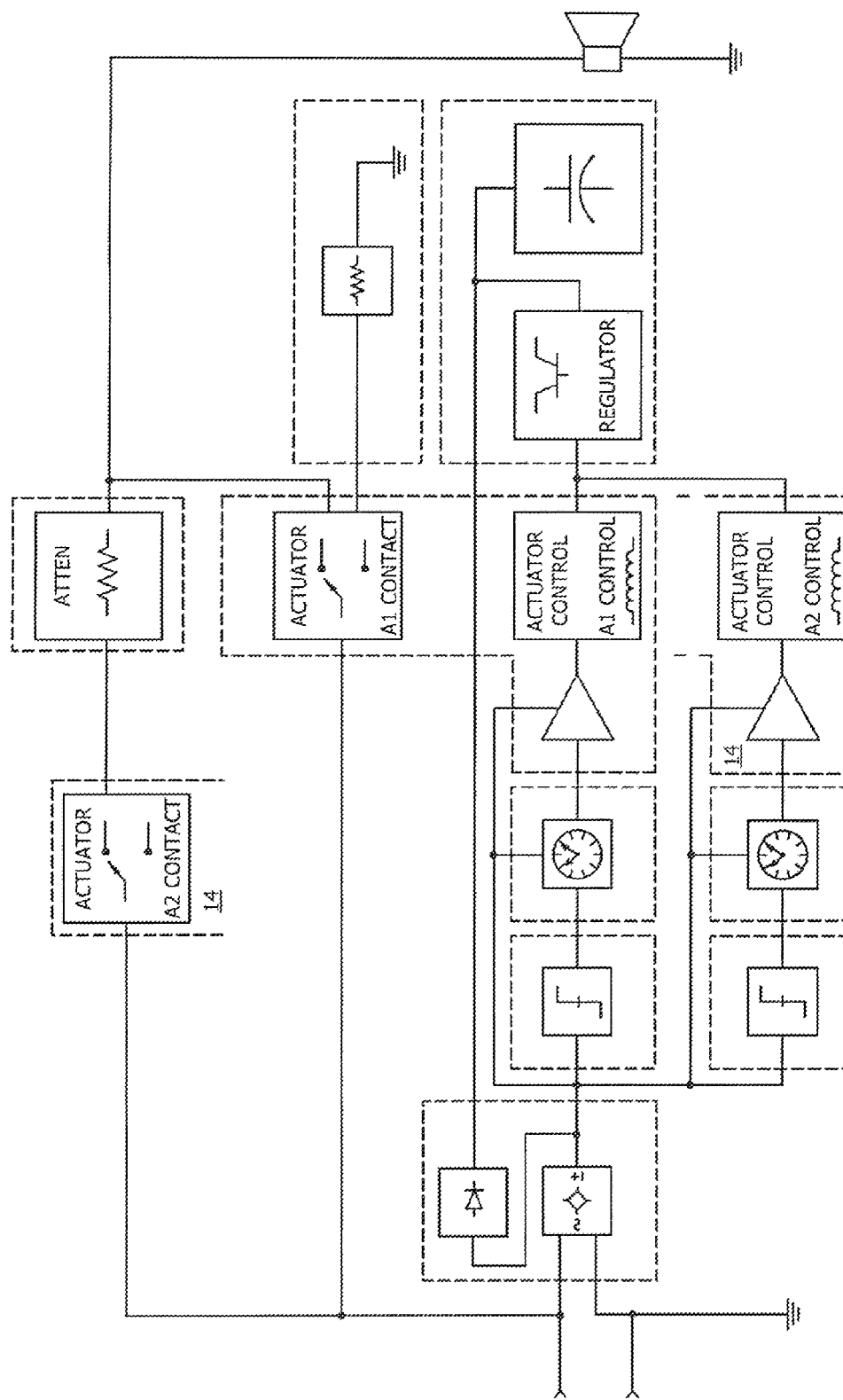
FIG. 2H is a schematic of a typical timed & detected, dual relay, lamp attenuator protection circuit.

The concepts and embodiments described herein provide AC protection and attenuation utilizing high-efficiency switch-mode techniques to attenuate an AC signal by incorporating a bidirectional, transistorized switch driven from a pulse width modulation signal, PWM. Embodiments of the circuits described herein monitor characteristics of an AC signal or load and determines the duty cycle of the pulse width modulated signal, PWM, based upon the duration and amplitude of the harmful event. Harmful events can include, over-voltage, over-current, over-limit, temperature, frequency, mechanical limit or other conditions that could be harmful to the load. For example, if the AC power signal exceeds a predetermined safe operating threshold by 10%, the pulse width modulated signal, PWM, will be derived with a 90% duty cycle. A preferred method of deriving the pulse width modulation signal, PWM, is to use a microcontroller device with an onboard analog to digital converter, ADC, for monitoring the AC power signal. However, it should be noted that derivation of the pulse width modulated signal, PWM, could be done through a variety of techniques common to the art of power management, such as a hysteretic control, triangle or saw intercept, or sigma-delta modulation. Utilizing high-efficiency switch-mode attenuation allows embodiments of the present invention to provide a low-loss, fully-programmable compressor limiter protection circuit that solves many of the problems plaguing prior art in the field of AC power protection and attenuation.

Embodiments of AC power protection circuitry according to the concepts described herein broadly include a power supply stage, a signal conditioning stage, a system control stage, an isolation stage, and a bidirectional switching stage. Several optional stages can be incorporated to create subsequent embodiments that will be presented in the detailed description.

Focusing on a preferred embodiment, the power supply stage is operable to receive an AC or DC signal and derive therefrom a regulated DC output voltage, REG, and a common ground signal, COM. When operating from an AC power signal, the power supply stage may receive the same AC power signal supplied to the bidirectional switching stage, meaning that embodiments of the present invention can derive power from (1) an auxiliary AC power signal, (2) the primary AC power signal that is passing through the bidirectional switching stage, or (3) a DC power signal. The regulated DC output voltage and common ground, REG and COM, are used by subsequent stages for powering various electrical devices and circuits.

In particular embodiments, the signal conditioning stage is operable to receive an AC input signal and derive therefrom a conditioned output signal, VMON, typically derived by rectifying and dividing the AC input. The AC input signal supplied to the signal conditioning stage can be received from the input or the output of the bidirectional switching stage, thus allowing either a feed-forward or feedback control loop topology. Therefore, the signal driving the input to the signal conditioning stage can be connected pre or post the bidirectional switching stage. The conditioned output signal, VMON, is sent to the subsequent system control stage for voltage monitoring and pulse width modulation derivation. Though not limited thereto, the signal conditioning stage may contain filtration components designed to limit the spectral content of the conditioned output signal, VMON. Limiting the spectral content of VMON effectively results in a system that is more sensitive to over-voltage events within the pass-band of the filtration and less-sensitive to overages outside the pass-band. Such filtration could be viewed as a form of pre-emphasis, where the primary voltage monitoring signal, VMON, has been pre-shaped prior to entering the system controller.

In particular embodiments, the system control stage may be configured to receive the following input signals: (a) the powering voltages from the power supply stage, REG and COM; (b) the voltage monitoring signal. VMON, received from the signal conditioning stage; and (c) an optional current monitoring signal, IMON, received from the isolation stage. With the aforementioned input signals, the system control stage may be configured to derive the following output signals: (a) the pulse width modulated control signal or signals, PWM, PWM2, etc.; (b) an optional power supply enable signal, ENBL; (c) an optional actuator bypass control signal, BYPAS, and (d) an optional limit sensing signal, LIMIT, received from a limit sense stage, or other sensor monitoring a mechanical or electrical characteristic of the load or other element of interest. A current monitoring signal, IMON, may be received from the isolation stage, and can be used to monitor the current flow through the bidirectional switching stage. In this configuration, the system control stage could monitor both the incoming AC voltage as well as the AC current flow to aid in deriving the pulse width modulated output signal, PWM, and detect load characteristics, variations or failures. Similarly, a limit sensing signal, LIMIT, may be received from the limit sense stage, and can be used to monitor various electromechanical limits of the AC load or bidirectional switch. In this configuration, the system control stage could monitor such parameters as load temperature, load mechanical movement (cone excursion or transducer RPM), or attenuator temperature to aid in deriving the pulse width modulated output signal, PWM, detect load characteristics, or detect over-temperature conditions within the bidirectional switching stage.

The system control stage is the core computational engine and can be implemented with a variety of techniques familiar to those skilled in the art; however, the preferred implementation uses an appropriate microcontroller device and Analog-to-Digital Converter (ADC) to allow full programmability of all system control tasks. Though not limited thereto, the system control stage may contain filtration components or signal processing algorithms designed to limit the spectral content of the incoming voltage or current monitoring input signals, VMON and IMON.

Generation of the pulse width modulation signal, PWM, is a primary task of the system control stage as this output signal can be used to effectively attenuate the AC input signal to the desired level. Computation of PWM can be based upon the extent of the over-limit, over-voltage or over-current scenario. For example, if the voltage monitor input, VMON, has exceeded a desired trip threshold by 3 decibels (dB) for a long enough duration, the system control stage will generate a 70% duty cycle waveform, resulting in a −3 dB voltage reduction. Additionally, duty cycle slew-rate limiting can be programmed to create a soft-knee to the attenuation characteristics. This achieves a "soft" sound in applications protecting loudspeaker transducers.

In certain embodiments, the isolation stage is operable to provide electrical isolation between the bidirectional switching stage and the system control and power supply stages, thus allowing the bidirectional switch to float with respect to common ground, COM. While not limited thereto, the isolation stage is typically configured to receive (1) the powering voltages from the power supply stage, REG and COM, (2) the pulse width modulated signal, PWM, from the system control stage, and (3) an optional power supply enable signal, ENBL, from the system control stage. With the aforementioned input signals, the isolation stage can be configured to derive the following electrically isolated signals, floating with respect to common ground, COM: (1) a floating pulse width modulated signal, PWM_A, (2) a floating regulated output voltage, REG_A, and (3) a floating common ground reference, COM_A. An optional floating current monitor signal, IMON_A, can also be received from the bidirectional switching stage and used to derive the current monitor signal, IMON, to send to the system controller. A variety of techniques for implementing the isolation stage will be presented in the detailed description.

In certain embodiments, the bidirectional switching stage can be configured to receive an incoming AC power signal, ACIN, the floating pulse width modulated signal, PWM_A, and the floating regulated output voltages, REG_A and COM_A, received from the isolation stage. From these signals, the bidirectional switching stage will derive the switched AC output signal, AC_SW, as well as an optional floating current monitor signal, IMON_A. While not limited thereto, the preferred embodiments implement the bidirectional switching stage using Field Effect Transistor (FET) devices and adequate gate drivers. Using FET semiconductors allows high-efficiency due to reduced switching losses; it provides easily scalable power levels due to the readily available supply of commodity devices operable over a broad range of voltage and current conditions; it achieves high-speed response due to the inherent semiconductor properties (typical turn-on times <100 nanoseconds); and can be used to implement an optional lossless current monitor using the internal FET on-resistance. All of these are benefits of utilizing Field Effect Transistors. Additionally, the bidirectional switching stage can be implemented using depletion or enhancement FET devices, or any other suitable devices to achieve the concepts described herein.

Alternate embodiments of the present invention incorporate additional bidirectional switching stages to provide free-wheeling or shunting current paths for the AC input source and the AC load. In these embodiments, the aforementioned series bidirectional switching stage is connected in series with the incoming AC power signal, while the free-wheeling bidirectional shunting switches are connected in parallel with the AC input source and the switched AC output AC_SW. Free-wheeling or shunting paths are required when the AC input is driven from an inductive source, such as a transformer or filter inductor, or the output AC load is inductive, such as a loudspeaker or induction motor. In certain applications, only one free-wheeling path is required due to the nature of the source and loading devices and conditions.

In certain embodiments, a limit sense stage is operable to monitor electrical or mechanical characteristics of the AC load, the bidirectional switching stage, and/or other element of interest and generate therefrom one or more limit signals LIMIT for transmission to the system control stage. Though not limited thereto, typical limit sensors could include temperature monitoring sensors for both the AC load and/or the bidirectional switches, as well as load movement sensors that sense the movement of the AC load, such as motor revolutions or loudspeaker cone displacement. This is particularly useful when protecting loudspeaker woofers from excessive cone displacement that may result in mechanical damage to the device.

The overall result of the present invention is a novel AC power protection and attenuation circuit that produces little heat, provides simple scalability, and is fully programmable to match the power handling characteristics of the most demanding sensitive AC loads. Effectively, the present invention creates a high-power AC compressor limiter circuit that excels at AC power protection as well as continuous AC attenuation applications.

Figure 3A:
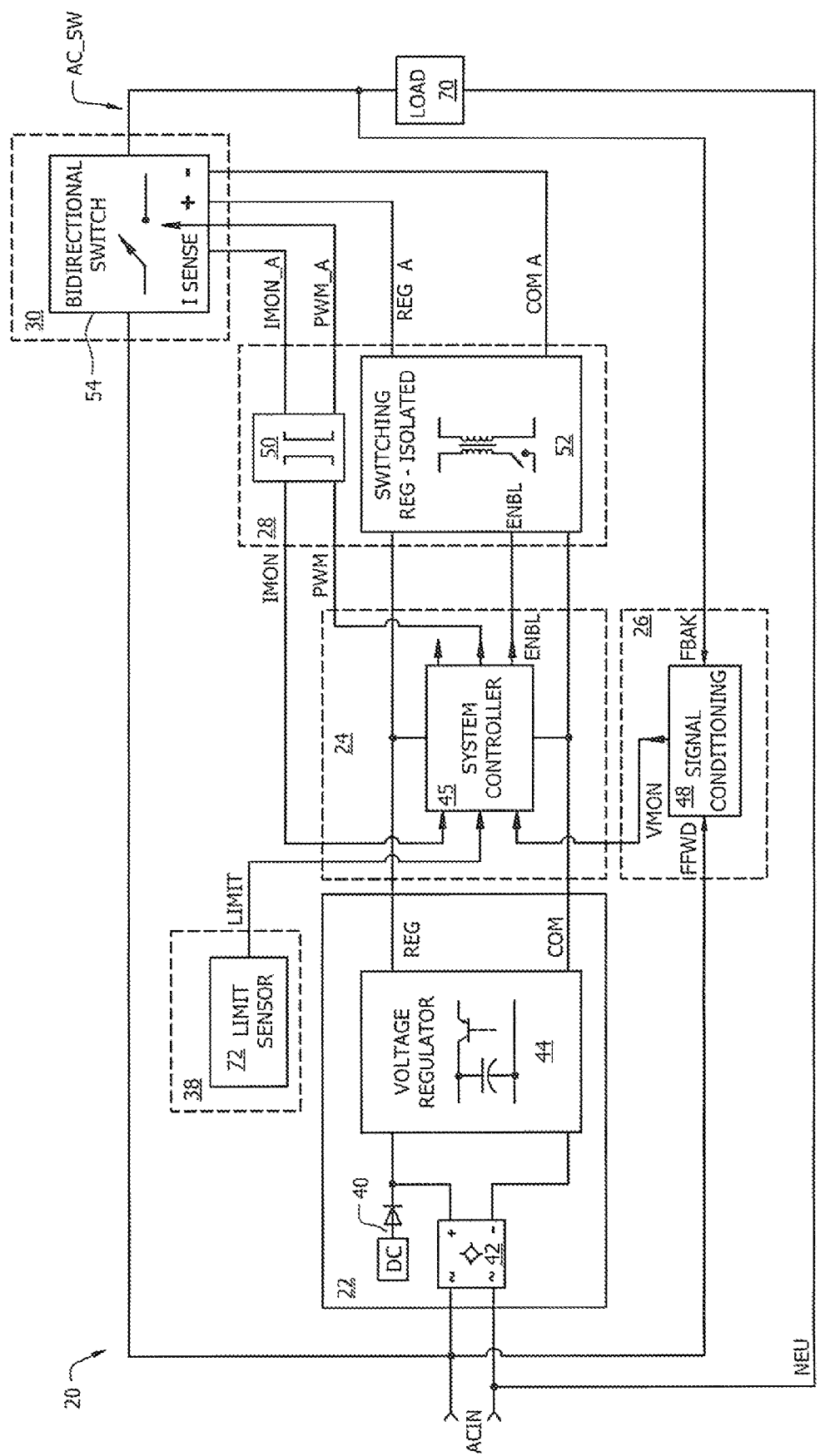
FIG. 3A is a block diagram of an embodiment of a protection and/or attenuation circuit according to the concepts described herein.

Referring now to FIG. 3A, an embodiment of AC circuit 20 that can be used as a protection and/or attenuation circuit is described. The protection circuit 20 can include optional current monitoring or limit sensing, and is drawn to illustrate the option of feed-forward or feed-back voltage monitoring. The protection circuit 20 broadly comprises a power supply stage 22; a system control stage 24; a signal conditioning stage 26; and isolation stage 28; and a bidirectional switching stage 30, and optional limit sensing stage 38.

The power supply stage 22 is operable to derive two voltage potentials, REG and COM, with REG being a regulated DC output voltage with respect to the common ground reference, COM. Though not limited thereto, the power supply stage 22 in FIG. 3A is illustrated with the input power signal connected to the input AC power signal ACIN. This topology allows protection circuit 20 to derive all necessary operational power from the same AC signal that is being monitored and attenuated for protection and/or attenuation purposes. Additional powering options exist that do not rely on the input AC signal, ACIN, for power, such as the optional DC input 40. Operating the power supply stage from an auxiliary DC input 40 allows the protection circuit 20 to function without the presence of the AC input signal ACIN. This can be beneficial if the AC input signal, ACIN, varies greatly in amplitude and can fall below the level required to power subsequent stages. The embodiment in FIG. 3A is shown with the AC input power signal, ACIN, connected to the power supply stage input. A rectification block 42 rectifies the AC input signal, ACIN, prior to subsequent voltage regulator 44. Several different topologies can be selected to create said voltage regulator 44, with the two most common approaches consisting of linear or switch-mode regulation techniques. The output of the voltage regulator 44 is the output of the power supply stage 22, REG and COM, which will be used to power the subsequent stages.

The system control stage 24 of circuit 20 is operable to derive a first pulse width modulation signal, PWM, and an optional enable signal, ENBL, used to enable the isolated power supply within the isolation stage 28. The objective of the system control stage 24 is to monitor one or more input signals for overage conditions and derive therefrom the aforementioned pulse width modulated signal, PWM. The system control stage 24 can be operated with a plurality of different input signals such as a voltage monitoring signal VMON, a current monitoring signal IMON, and/or temperature, movement, position, or other monitoring signals LIMIT. While not limited thereto, the system control stage 24 in the preferred first embodiment monitors the voltage signal, VMON, the current signal, IMON, and the limit signal LIMIT. The voltage monitoring signal, VMON, is received from the signal conditioning stage 26 the current monitoring signal, IMON, is received from the isolation stage 28, and the limit signal, LIMIT, is received from the limit sensing stage 38. In practical use, protection circuit 20 only requires one input monitor signal to provide a minimal level of protection. For example, protection circuit 20 could be implemented without series current monitor signal, IMON. In this configuration, the protection circuit will provide protection against over-voltage events, without the ability to monitor electrical current flow. Similarly, protection circuit 20 could be implemented without voltage monitor signal, VMON. In this configuration, the protection circuit will provide protection against over-current events, without the ability to monitor AC voltage.

One benefit achieved by monitoring both voltage and current conditions is the ability for the system controller to effectively calculate the load impedance and detect conditions which may result in damage to bidirectional switching stage 30 or the load 70. Additionally, by monitoring one or more limit signals, such as load temperature, load electromechanical movement, and/or bidirectional switch temperatures, the system controller 45 can better protect the AC load as well as the bidirectional switch 30. System Controller, 45, could be implemented with a variety of devices and/or circuits including, but not limited to, a microcontroller, a programmable logic device, an application specific integrated circuit, a pulse width modulation integrated circuit, or a discrete pulse width modulation circuit. System control stage 24 is powered from DC voltage potentials REG and COM received from the power supply stage 22.

The signal conditioning stage 26 of circuit 20 is operable to receive an AC voltage and derive therefrom a voltage monitoring signal VMON for transmission to the aforementioned system control stage 24. The signal conditioning stage 24 can receive AC voltages from either the AC input, ACIN, or the output from the bidirectional switching stage 30, AC_SW, thereby allowing either a feed-forward or feed-back control loop. Conditioning of the AC signal typically involves rectification, voltage division, and/or filtration. Depending on the implementation of the system control stage, 24, differing requirements will be subjected upon the signal conditioning stage 26. For example, when using a microcontroller device for system control stage 24 and an on-chip Analog to Digital Converter (ADC), the signal conditioning stage 26 is required to derive the voltage monitoring signal, VMON, as a unipolar signal with limited signal voltage swing, typically less than 2 volts peak. This can be accomplished with a simple rectification circuit, a voltage division circuit, and a voltage limiter device for added protection, typically a zener diode.

The isolation stage 28 of circuit 20 is operable to provide electrical isolation between all common ground, COM, referenced signals and the bidirectional switching stage 30. This allows bidirectional switching stage, 30, to electrically float with respect to the common ground reference signal, COM, provided by power supply stage 22. With respect to the first preferred embodiment, the isolation stage 28 receives the power supply signals REG and COM from power supply stage 22; the pulse width modulated signal PWM from the system control stage 24; an optional enable signal from the system control stage 24; and the optional current sense monitor signal, IMON_A, from the bidirectional switching stage 30. From the aforementioned input signals, the isolation stage 28 derives therefrom isolated DC voltages REG_A and COM_A; isolated pulse width modulated signal PWM_A; and an isolated current monitoring signal IMON. The isolated DC voltages REG_A and COM_A, as well as the isolated pulse width modulated signal PWM_A are sent to the bidirection switching stage 30. Isolated current monitoring signal, IMON, is sent to the system control stage 24 for use in deriving the pulse width modulated signal PWM and or the enable signal ENBL. Though not limited thereto, implementation of isolation stage 28 can be achieved through the use of an isolated switching regulator 52 and signal isolation device or devices 50 typically utilizing optical isolation techniques.

The bidirectional switching stage 30 of circuit 20 is operable to receive the main AC input signal, ACIN, and the signals from the isolation stage 28 and derives therefrom an electronically controlled switched AC signal, AC_SW. In the first preferred embodiment, the bidirectional switching stage 30 receives power signals, REG_A and COM_A, as well as the pulse width modulated signal PWM_A from the isolation stage 28. Power signals REG_A and COM_A are used to establish the required voltage potentials for proper driving of the bidirectional switch 54. Though not limited to, bidirectional switch 54 can be implemented using two Metal Oxide Field Effect Transistors (MOSFETs) connected in a series fashion with common source terminals: Such devices typically require 5 to 10 volts of gate drive to enable full conduction. Pulse width modulated signal PWM_A is used to control the actuation of the bidirectional switch, and in the case of a MOSFET implementation, PWM_A would effectively be controlling the gate drive circuit of the transistors. There are cases where pulse width modulated signal PWM_A will be operated at 100% duty, or continuously on; thereby holding the bidirectional switch 30 in continuous conduction mode. The bidirectional switching stage 30 can be implemented to allow electrical current monitoring through the use of current sensing techniques. If included in the design, the output signal of the current monitor, IMON_A, can be sent to the isolation stage 28 for the effective transmission to the system control stage 24. In the case of a MOSFET implementation of bidirectional switch 54, the current sensing circuitry can be lossless as the MOSFET device intrinsic on resistance can be used as a current sensing element. Feeding the current monitoring signal, IMON_A, back to the system controller 24 allows for a more thorough protective control loop and provides a means to monitor load impedance variations and real power delivered.

The output of said bidirectional switching stage 30 of circuit 20 is connected directly to the load, 70; however, there may be conditions where passive filtration is desired between the output of bidirectional switching stage 30 and the load 70. This filtration may be implemented with inductive capacitive filter circuits though other devices and techniques can be applied to achieve the desired characteristics. Additionally, there may be conditions wherein placing a passive filter between the AC input, ACIN, and the input of the bidirectional switching stage 30 is desirable.

The limit sensing stage 38 of circuit 20 is operable to provide one or more limit sensing signals, such as LIMIT, for transmission to the aforementioned system control stage 24. The limit signals LIMIT can be derived as either a discrete-time digital signal or an analog signal. In the case of an analog signal, the limit sensing stage 38 may incorporate analog filtration to curtail the spectral content of the limit signal LIMIT. Limit sensing stage 38 can receive power from the power supply stage 22 if so connected. Though not limited thereto, preferred embodiments can include a plurality of limit sensing signals LIMIT broadly consisted of (1) a temperature sensing signal coupled to the physical devices comprising the bidirectional switching stage 30, (2) a temperature sensing signal coupled to AC load 70, and (3) a movement sensing signal coupled to the AC load 70. Movement sensing is ideal for AC motor applications such as a loudspeaker where the motor has certain mechanical excursion limits, which if exceeded, will cause permanent damage to the load. Implementation of a movement sensor within the limit sensing stage 38 can be accomplished using readily available integrated circuits such as accelerometers, optical pickups, or simple optical breaks. Likewise, implementation of adequate temperature sensors within the limit sensing stage 38 can be achieved with thermistors, thermostats, temperature dependant diodes, or integrated circuit temperature sensors.

Figure 10A:
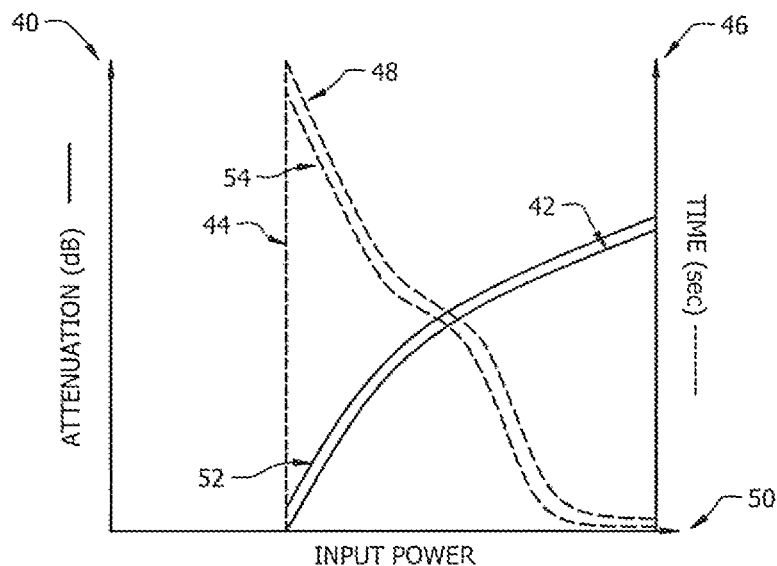
FIG. 10A is a plot of typical loudspeaker power handling characteristics overlaid with the an illustration of the exemplary operation of the embodiment of the circuit shown in FIG. 3A.

The resulting characteristics of the embodiment of circuit 20 of FIG. 3A are illustrated in FIG. 10A. Note that the amplitude characteristics, line 52, of the first preferred embodiment can be tailored to match the AC load requirements with a high degree of accuracy. Similarly, the time duration characteristics, line 54, of the first preferred embodiment can be programmed to match the sensitive AC load timing requirements. The net result is uninterrupted operation over the entire load power handling specification while ensuring the load is always within the safe operating region, i.e. no damage regions. Time domain characteristics are illustrated in FIG. 7 wherein a timing diagram includes ACIN, VMON, a timer counter, PWM, and AC_SW.

Figure 3B:
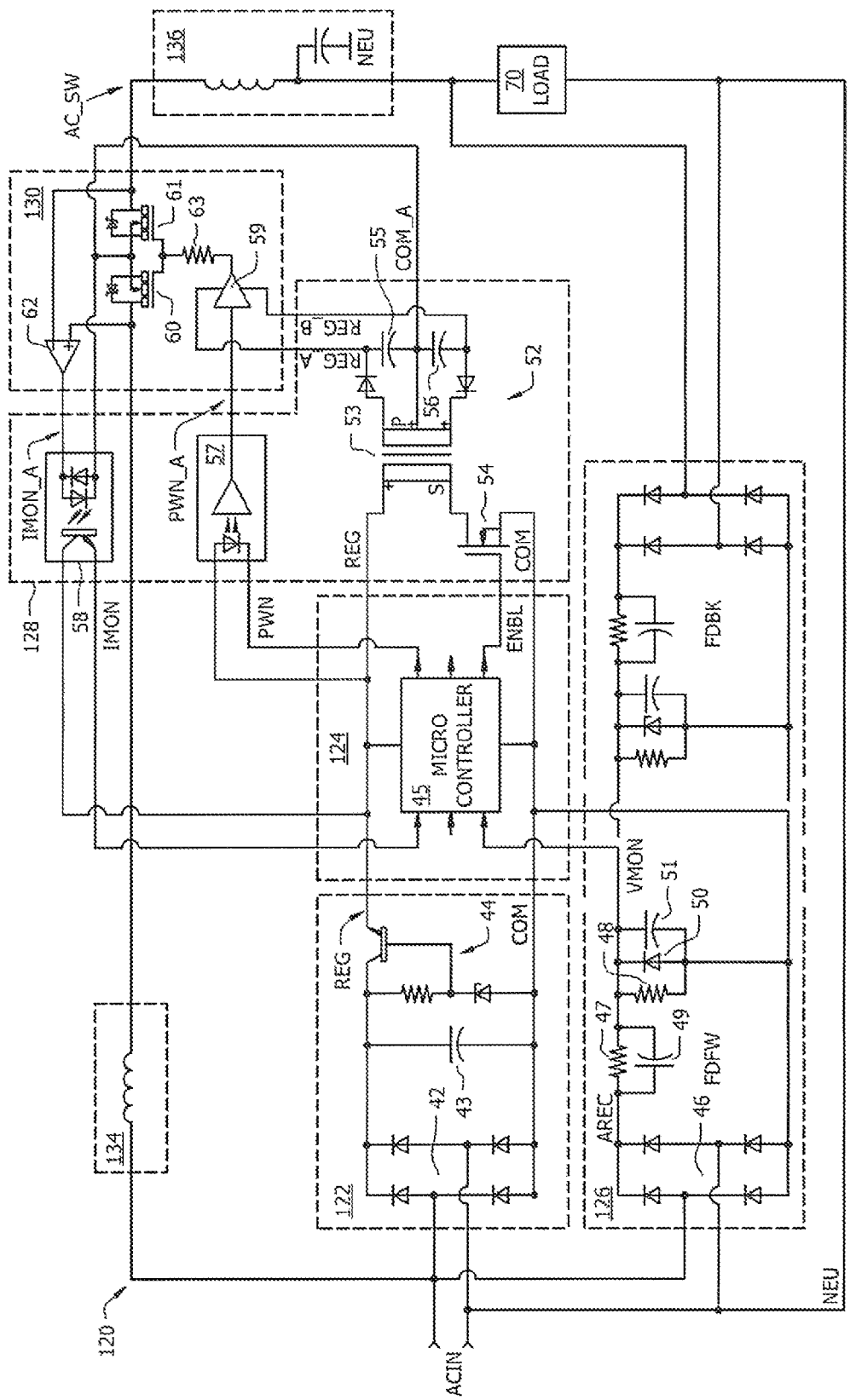
FIG. 3B is a circuit diagram of an exemplary embodiment of the circuit shown in FIG. 3A.

Referring now to FIG. 3B, a detailed example of a circuit to implement circuit 20 of FIG. 3A is described. As shown in FIG. 3A, embodiments of the circuit can consist of a single power supply stage 122, a system control stage 124, a signal conditioning stage 126, and isolation stage 128, and a bidirectional switching stage 130. The detailed illustration is presented with the signal conditioning stage 126 operable to accept either a feed forward AC input signal or a feed back AC signal received from the output of the bidirectional switching stage 130. In practical applications, the signal conditioning stage 126 would preferably be constructed with only one of the two possible AC input signals, FDFW or FDBK; however, both were included in FIG. 3B for illustration purposes only.

The power supply stage presented can be implemented with the input power being derived from the primary AC input signal ACIN. In this configuration, the first preferred embodiment will derive all operational power from the AC power signal that is being monitored and attenuated by the system control stage 124 and the bidirectional switching stage 130. Rectification is the first component in power supply stage 122 and is typically accomplished through the use of a full-wave bridge rectifier circuit 42. Following rectification, the preferred embodiment uses capacitor 43 to provide voltage smoothing followed by a simple linear regulator 44 to regulate the voltage to a nominal DC potential, REG, with respect to the common ground potential, COM. Alternate techniques could be used for the derivation of a regulated output voltage, REG, such as buck or boost switching regulation topologies. These techniques would allow for reduced power loss, at the cost of increased system price. Both linear voltage regulators and switching regulators have been used within power supply stage 122 during laboratory testing of the preferred first embodiment.

The system control stage 124 is shown in accordance with a preferred embodiment, wherein a microcontroller device is used for system control tasks. Specifically, the microcontroller 45 is responsible for monitoring the voltage monitor signal VMON and/or the current monitoring signal, IMON, and deriving therefrom, a pulse width modulated signal PWM, as well as an optional enable signal, ENBL, for use within the isolation stage 128. Ideally the microcontroller 45 is selected to contain a suitable Analog to Digital Converter (ADC) for converting the voltage monitor signal VMON or the current monitor signal IMON, into a discrete time digital signal. This topology allows microcontroller 45 to monitor voltage and/or current within the discrete time domain, thereby enabling firmware algorithmic control over the derivation of said pulse width modulation signal, PWM, and optional enable signal, ENBL. Such algorithms can be developed to hold the duty cycle at 100% until the monitored AC voltage and/or current exceed programmable thresholds for amplitude and duration. If the input signals, VMON or IMON, exceed the algorithms amplitude and duration thresholds, the pulse width modulation, PWM, duty cycle can be reduced using a slewing algorithm, wherein the rate in which the duty cycle changes is controlled by timing coefficients. Controlling the duty cycle rate of change, or slew, allows microcontroller, 45, to create a soft knee in the amplitude reduction, thereby allowing a topology that can emulate the soft characteristics of a lamp filament.

Figure 8:
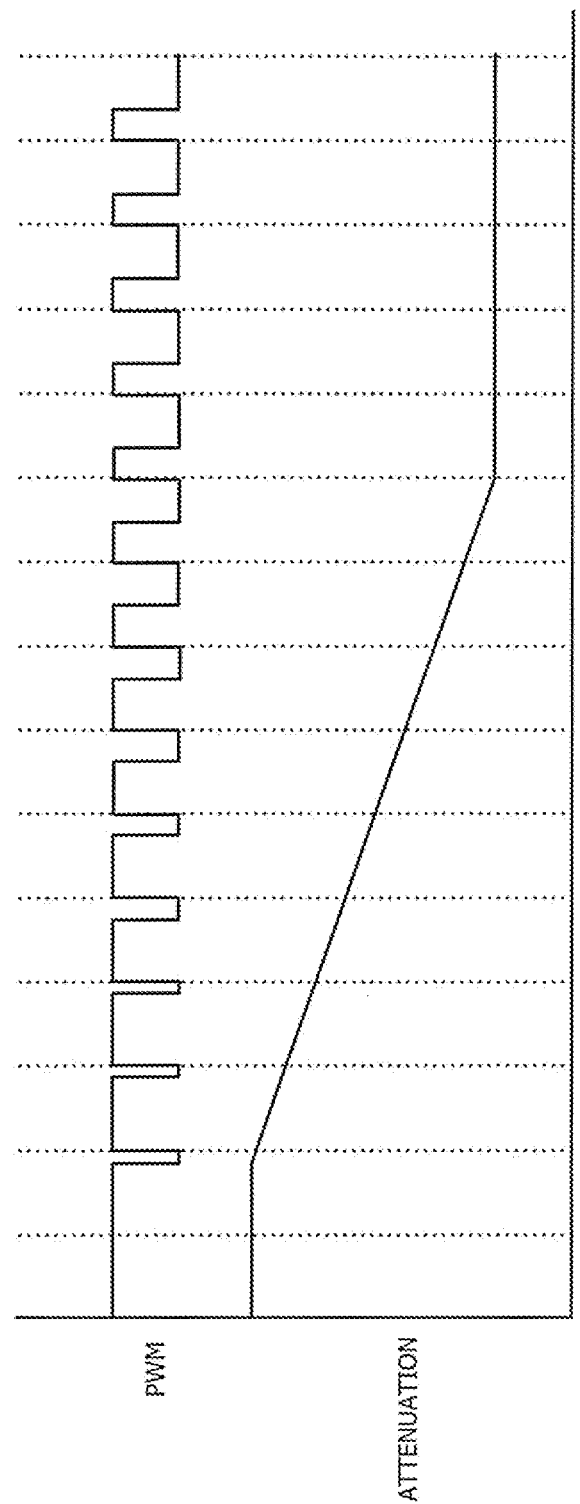
FIG. 8 is a timing diagram of pulse width modulation slewing.

A time-domain plot is presented in FIG. 8 illustrating pulse width modulation slewing. Though not limited thereto, a time domain plot of a typical pulse width modulation signal entering and exiting from an over-voltage event is presented in FIG. 7, wherein the signal TIMER COUNT is representative of a simple incrementing counter incorporated within the algorithm. There are situations wherein it is advantageous to increase or decrease the speed of a timing signal such as TIMER COUNT depending on the magnitude of the over-voltage or over-current event. In these circumstances, algorithms can be developed to increase or decrease the timer clock speed or the timer expiration value. These techniques are obvious to one skilled in the art. Additionally, there are cases where system control stage, 124, may be implemented without the use of a programmable microcontroller or Field Programmable Gate Array, FPGA, and in these cases TIMER COUNT can be implemented with various digital or analog timers, such as a discrete counter or a simple resistive capacitive, RC, timer. Lastly, microcontroller 45 derives all necessary operational power from power supply stage output signal REG and is ground referenced to the common signal COM.

Figure 11:
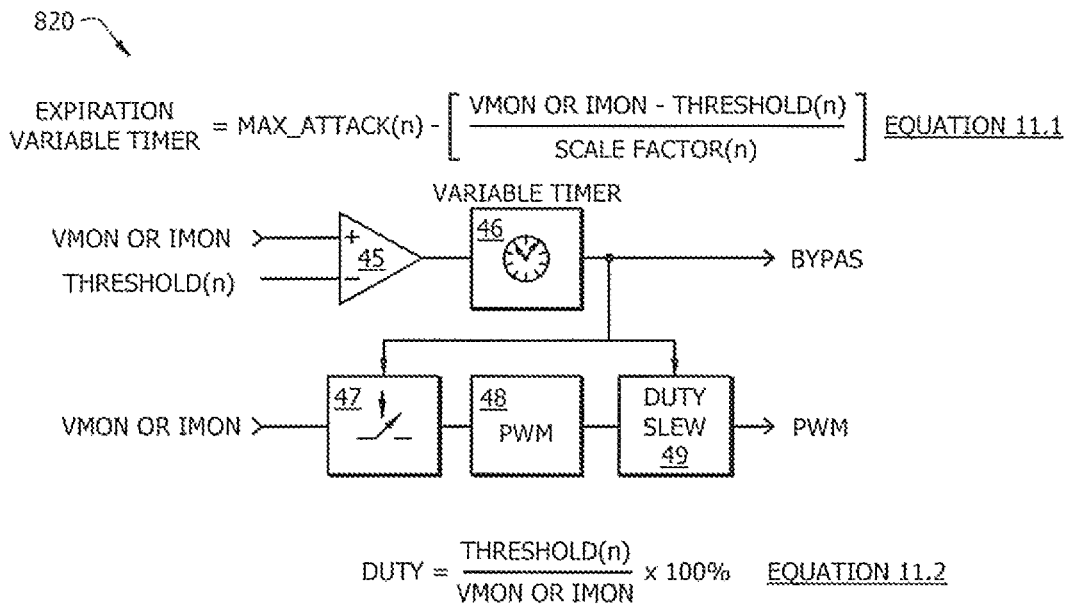
FIG. 11 is a basic algorithm flow diagram showing the operation of an embodiment of the system control stage of a circuit according to the concepts described herein.

Referring to FIG. 11, an embodiment of a basic algorithm flow, 820, is presented for operation within the aforementioned system control stage, wherein algorithm flow, 820, is a representative algorithm that can be implemented within the system control stage firmware, software, or hardware. A preferred method of implementation is within firmware using standard coding practices that allow for a plurality of thresholds, THRESHOLD(n), differential comparisons, 45, and variable timers, 46; therefore achieving an algorithm that supports multiple thresholds and delay times. This is typically implemented using a looping algorithm that compares each sample input, VMON or IMON, against thresholds, THRESHOLD(n), and maximum attack times, MAX_ATTACK(n), resulting in a multi-stage implementation. For example, a minimal implementation will require (1) a Root Mean Square (RMS) voltage threshold that directly relates to the AC load specification; and (2) a peak voltage threshold. The maximum attack time is typically much shorter in duration for the peak voltage threshold, and much longer in duration for the RMS voltage threshold; therefore, multiple delay times are required. In this case, basic algorithm flow, 820, would have two thresholds, THRESHOLD(1) and (2), two maximum attack times, MAX_ATTACK(1) and (2), and two scale factors, SCALE(1) and (2), and the algorithm would be repeated two times for every incoming data sample of VMON or IMON.

In the case of operation within the second preferred embodiment, wherein a bypass signal, BYPAS, is required, the basic algorithm, 820, can be implemented with a third set of parameters, THRESHOLD(3), MAX_ATTACK(3), and SCALE(3), that are set to trip well before the RMS or peak voltage thresholds, THRESHOLD(1) and (2), and can generate a signal, BYPAS, to control the switched bypass stage, which will be discussed later. Basic algorithm flow, 820, is similar to the discrete implementation presented in US Patent Application Publication No. 2008/0165977; however, precise controls over gain reduction, attenuation, levels are calculated, including the ability to shape the attenuation attack and release knee. This is accomplished through pulse width modulation block 48 and duty cycle slewing block 49. Timer 46 will hold off the input to the pulse width modulator, 48, and duty slew, 49, until the input signal has exceeded the threshold, THRESHOLD(n), for a calculated duration, EQUATION 11.1.

Once timer 46 has expired, the pulse width modulation duty cycle can be calculated using a simplified duty calculator, EQUATION 11.2, wherein the ratio of the threshold, THRESHOLD(n), and input signal, VMON or IMON, is calculated. Duty cycle slewing, 49, provides the ability to control the attenuation attack and release knee, thereby allowing a more musical sound when used with loudspeaker loads, and the capability to emulate known attenuation devices such as lamps or thermistors. Duty cycle slew, 49, can be implemented by monitoring the target duty cycle, as calculated by the pulse width modulator, 48, and moving towards that target duty cycle in a computed fashion. For example, if the target duty cycle is somewhat close to the current duty cycle of the output signal, PWM, duty cycle slew, 49, may step the output duty cycle of PWM by smaller values. However, if the target duty cycle, as calculated by pulse width modulator 48, is significantly different than the output duty cycle of said signal PWM, the duty cycle slew, 49, may step the output duty cycle of PWM by larger values. In this fashion, the duty cycle slew, 49, can be provided various input parameters, including the output of variable timer 46 to control the stepping action of the output signal, PWM, duty cycle. Basic algorithm 820 could be implemented within a variety of platforms including programmable logic devices, microcontrollers, or discrete logic. Alternative algorithms have been developed that minimize the usage of variable timer 46 and rely on duty slew 49 to achieve the desired attack and release times necessary for protection.

Referring again to FIG. 3B and considering the aforementioned discussions concerning basic algorithm flow, FIG. 11, it should be obvious to one skilled in the art that a non-programmable implementation of system control stage, 124, could be implemented using a gated pulse width modulation circuit. Although potentially limited in functionality, one could implement the detection and timing stages as illustrated in US Patent Application Publication No. 2008/0165977, the contents of which are hereby incorporated by reference, to gate a pulse width modulator circuit that compares the analog input signal, VMON or IMON, to a triangle or saw waveform for derivation of pulse width modulated Signal PWM. It should also be obvious to one skilled in the art that many different algorithms could be applied within system control stage 124 wherein the input monitored signal VMON or IMON could be subjected to discrete time, digital filters within the microcontroller. Such digital filters can be used to shape the frequency content of the input to the over-voltage, over-current detection, attack/release, and PWM algorithms.

Signal conditioning stage 126 is operable to receive an AC voltage input signal and derive therefrom a conditioned voltage monitor signal, VMON. Presented in the circuit shown in FIG. 3B are two optional configurations of the signal conditioning stage: (1) a feed forward signal path, FDFW; and (2) a feed back signal path, FDBK. The preferred embodiment is typically implemented with one of the two signal paths, FDFW or FDBK; however, this does not limit the capability of feeding both signals to the system control stage. Regardless of which signal path, FDFW or FDBK, is used for derivation of the voltage monitor signal, VMON, the typical devices used to implement the signal conditioning stage are the same. Looking at the feed forward signal path, FDFW, the AC input signal ACIN is connected to the input of the signal conditioning stage, wherein ACIN is rectified by full-wave rectifier, 46, to create the signal AREC.

Following rectification, the preferred first embodiment reduces the amplitude of the signal AREC through simple voltage division achieved through resistors 47 and 48. Though not limited to, zener diode 50 is typically installed to protect the subsequent microcontroller 45 from over-voltage damage. Capacitors 49 and 51 provide the ability to introduce poles and or zeros within the transfer function of the signal conditioning stage 126. These filtration elements, capacitors 49 and 51, are optional an can be used to effectively shape the response of the output voltage monitor signal VMON. Considering now the feed back signal path, FDBK, the aforementioned techniques and components used in the feed forward signal path, FDFW, are directly applicable. Though not illustrated in FIG. 3B, active components such as op-amp or switched capacitor circuits could be used within the signal conditioning stage 126, wherein operating power could be sourced from the power supply signal REG. The resulting output voltage monitor signal, VMON, is a voltage divided, voltage limited, and frequency shaped signal operable for transmission to the system control stage 124 for voltage monitoring purposes.

Isolation stage 128 is operable to provide electrical isolation between all common ground, COM, referenced signals and the bidirectional switching stage 130. This includes, but not limited to, the following common ground, COM, referenced signals: REG, PWM, IMON, and ENBL. Incorporating electrical isolation allows bidirectional switching stage 130 to float with respect to the common ground signal, COM, thus allowing the bidirectional switch to function at high voltage potentials. The embodiment of FIG. 3B uses a combination of techniques to achieve electrical isolation. Specifically, to create an electrically isolated power signal derived from the power supply signal REG, the first preferred embodiment uses a transformer isolated switching regulator circuit, 52. Switching regulator 52 can be constructed with switching transistor 54, a high-frequency transformer 53 operable with at least one primary and one secondary, and one or more non-synchronous rectification and capacitive smoothing circuits, 55 and 56. The aforementioned components comprising switching regulator 52 can be arranged in a buck, boost, or buck/boost configuration.

The embodiment shown in FIG. 3B is constructed in a boost configuration with high-frequency transformer 53 having dual secondary windings or a single center-tapped secondary. In this topology, switching regulator 52 provides two isolated voltage signals, REG_A and REG_B, as well as a common midpoint reference signal COM_A, thereby achieving a bipolar output voltage centered around midpoint COM_A. In addition to deriving the floating power signals REG_A, REG_B, and COM_A, the isolation stage 128 is operable to electrically isolate the pulse width modulated signal, PWM, received from the system control stage 124. Isolating a digital logic signal such as PWM can be achieved with several different topologies and/or isolating devices.

Figure 6A:
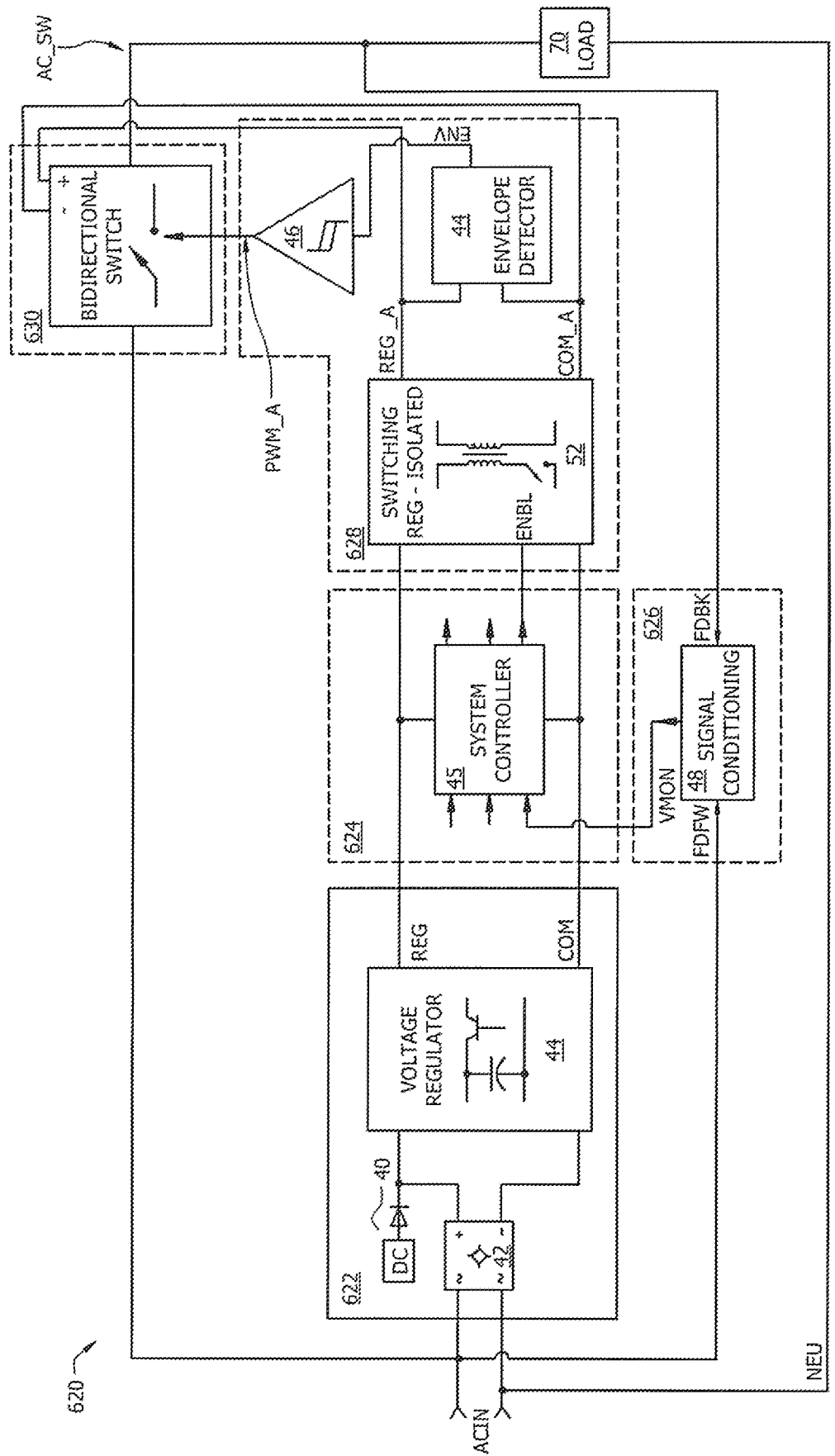
FIG. 6A is an alternate embodiment of a circuit according to the concepts described herein.
Figure 6B:
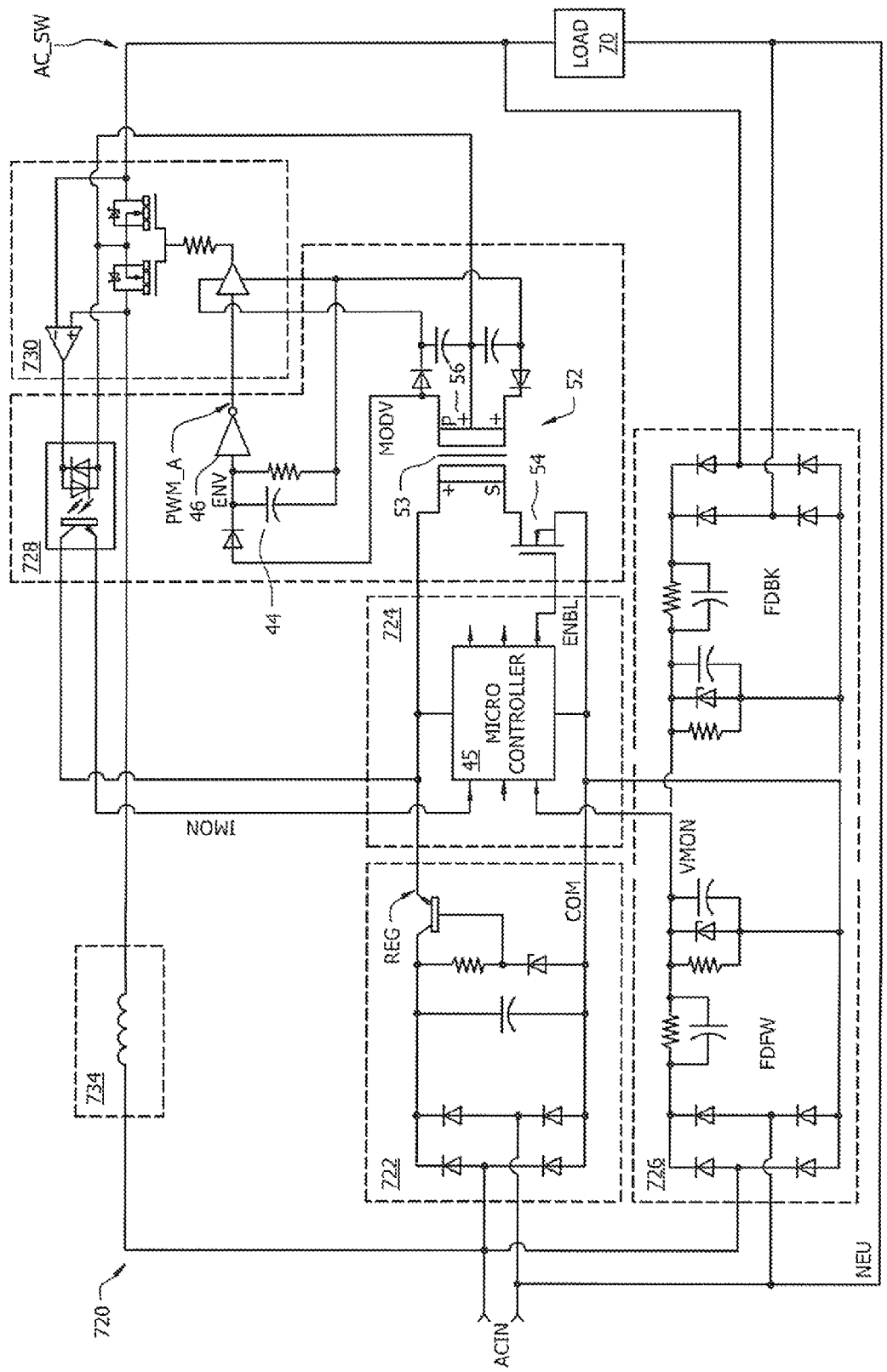
FIG. 6B is a circuit diagram of an exemplary embodiment of the circuit shown in FIG. 6A.

While the present embodiment uses a standard isolating device for PWM, such as optical isolator 57, an additional technique for isolating PWM will be presented in the discussion of FIG. 6A and FIG. 6B. Incorporating optical isolator 57 allows the common ground, COM, referenced pulse width modulated signal, PWM, to be electrically isolated from the bidirectional switching stage 130. Optical isolator 57 receives the said pulse width modulated signal, PWM, from the system control stage 124 and provides a pulse width modulated output signal, PWM_A, that is electrically floating with respect to the common ground reference, COM. Floating pulse width modulated output signal, PWM_A, is connected to the input of the bidirectional switching stage, 130, gate driver 59. Lastly, isolation stage 128 is operable to isolate the floating current monitor signal, IMON_A, received from the bidirectional switching stage, 130, and derive therefrom, the current monitor output signal IMON for transmission to the system control stage 124. Though not limited to, isolation of floating current monitor signal, IMON_A, is achieved through bipolar-input optical isolator 58.

Referring again to FIG. 3B, the bidirectional switching stage 130 is operable to receive the AC input signal, ACIN; the floating pulse width modulated signal, PWM_A; the floating power signals REG_A, REG_B, and COM_A; and derive therefrom a switched output AC signal, AC_SW. Additionally, the bidirectional switching stage is operable to derive a current monitoring signal, IMON_A, for transmission to the isolation stage 128. Bidirectional switching stage 130 is comprised of common-source connected FET transistors 60 and 61, a gate driver circuit 59, and an optional current sense amplifier 62. In the preferred first embodiment, transistors 60 and 61 are selected as N-channel depletion MOSFET devices, which allow electrical conduction between the AC input, ACIN, and the switched AC output, AC_SW, even with minimal AC input amplitudes. This is due the inherent design of the depletion FET, wherein the FET provides a free-electron channel for conduction in the absence of any gate-to-source voltage (Vgs=0). In other words, selecting depletion FET devices for transistors 60 and 61 achieves a normally-closed bidirectional switch operation. This is ideal for audio loudspeaker applications where the input AC signal, ACIN, greatly varies in amplitude and may not exceed a minimum gate turn-on threshold. Transistors 60 and 61 are configured with their source terminals connected together, thereby eliminating body diode conduction during opposite polarity conditions.

The drain terminal of transistor 60 forms the input to the bidirectional switch, while the drain terminal of transistor 61 creates the output of the bidirectional switch. Gate terminals for both transistors 60 and 61 are connected together and driven from gate driver 59. Typical gate drive elements, such as series gate resistor 63 can be used to control the turn-on or turn-off time of transistors 60 and 61. Gate driver 59 derives power from the floating power signals REG_A and REG_B, while the common source terminals of transistors 60 and 61 are connected to the floating common midpoint reference signal, COM_A. This topology allows gate driver 59 to effectively pull the gate terminals of transistors 60 and 61 above and below the potential of the source terminals, thereby achieving full-conduction and full-cutoff of the depletion FET devices 60 and 61. The bidirectional switching stage 130 can provide a lossless current monitor output, IMON_A, by measuring the voltage drop across the bidirectional switching transistors 60 and 61, thus eliminating the requirement for lossy current sensing resistors.

Differential amplifier 62 non-inverting and inverting inputs are connected across the bidirectional switching transistors so as to create a single ended output signal proportional to the differential voltage drop across the bidirectional switching transistors 60 and 61. The transfer function of differential amplifier 62 can be tailored to meet different requirements by utilizing common op-amp gain and filtration topologies common to the art. Differential amplifier 62 is powered from the floating power signals REG_A and REG_B, which provides dual polarities with respect to the common source reference, COM_A. By powering differential amplifier 62 with a dual polarity supply, with respect to transistor 60 and 61 source terminals, the circuit can measure current flow in either direction through the bidirectional switching transistors 60 and 61, thereby achieving bidirectional current sensing.

The AC input signal, ACIN, is connected to the input of the bidirectional switching stage 130, the drain terminal of transistor 60, and the AC load, 70, is connected to the output of the bidirectional switching stage, AC_SW, the drain terminal of transistor 61; however, it can be desirable to place inductive filtration in either the AC input signal path, 134, and/or the switched AC output signal AC_SW. Inductive filtration smoothes the current ripple due to the pulse width modulated switching of the AC output, AC_SW, and reduces the high frequency signal content on both the AC input, ACIN, and the switched AC output, AC_SW. Though not limited thereto, FIG. 3B illustrates both possible locations for inductive filtration in blocks 134 and 136. These inductive filters can be made with simple low-valued inductors or a combination of inductive and capacitive elements.

Figure 4A:
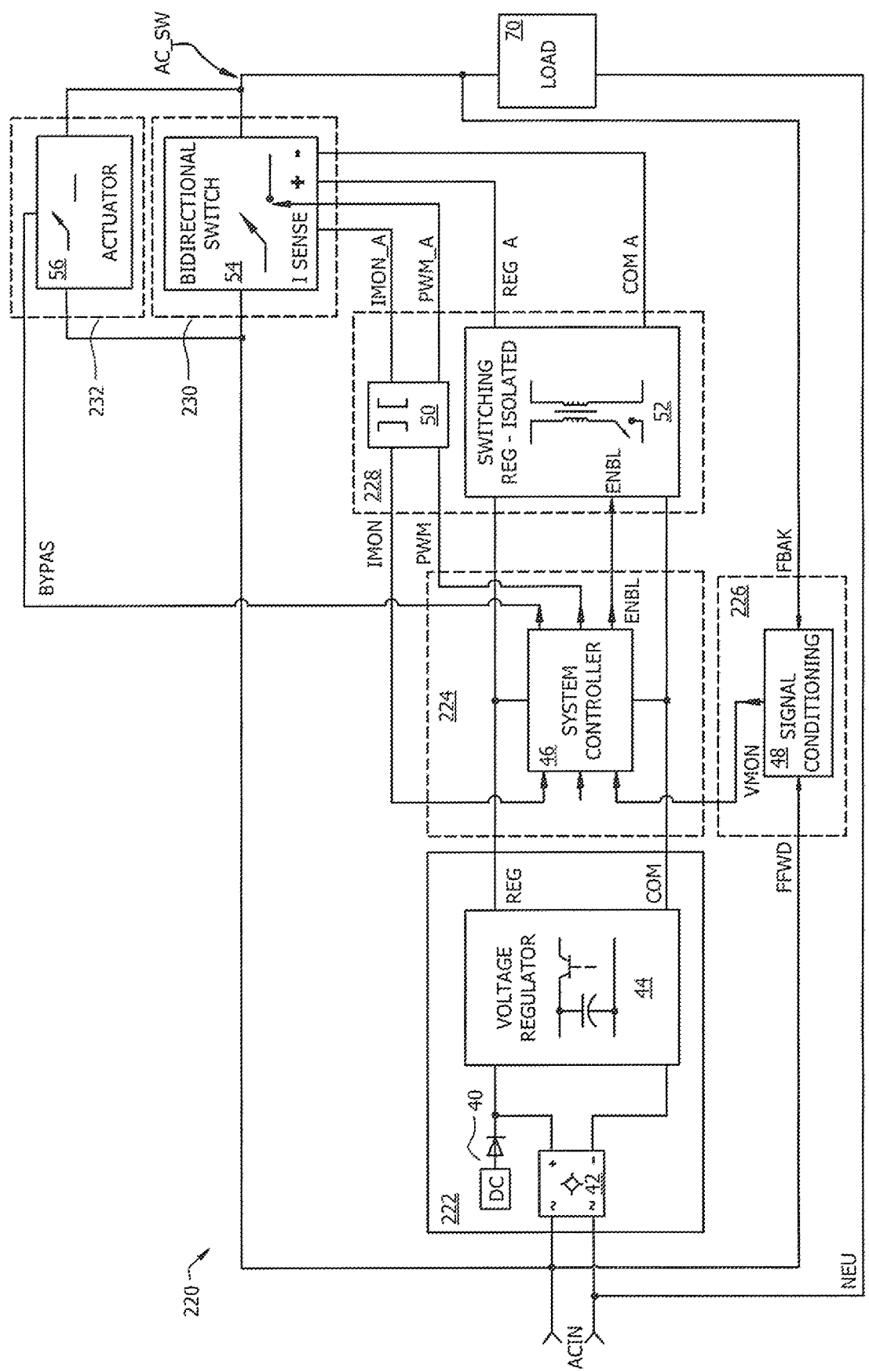
FIG. 4A is a block diagram of an alternate embodiment of a circuit according to the concepts described herein.

Referring now to FIG. 4A, a simplified block diagram of an alternate embodiment of a circuit according to the concepts described herein is shown. Circuit 220 broadly comprises the same stages as discussed in regards to the embodiment of FIG. 3A, however, circuit 220 also includes a switched bypass stage, 232, operable to provide a signal path around the bidirectional switching stage, 230. Though not limited thereto, the switched bypass stage 232 is typically implemented with an electromechanical or solid-state transistorized relay device that is controlled by the system control stage, 224, output signal, BYPAS.

The purpose of adding the switched bypass stage 232 is to allow a signal path for AC current flow during times when the AC input, ACIN, is below a minimum operable threshold required for bidirectional switch 54 to be conductive, thereby allowing enhancement mode devices to be selected for bidirectional switch 54. Enhancement devices are more readily available than high-power depletion FET devices, and thereby lower the system cost; however, unlike depletion devices, they do not benefit from an inherent zero gate voltage conductive state. Using enhancement mode FET devices does not allow for normally closed operation, rather they inherently form a normally open bidirectional switch, thus requiring a closed path for AC current flow in the absence of adequate gate drive potential. In certain applications, the switched bypass stage 232 has been constructed using smaller depletion FET devices that effectively create a solid-state relay or bypass path for AC current flow. In this case, the bypass stage 232 has received power from bidirectional switching stage 230. The current monitoring output of the bidirectional switching stage, 230, is not shown in circuit 220 in an effort to reduce the block diagram size; however, the current monitoring functionality discussed with regards to the first preferred embodiment can be applied to circuit 220 as well.

Figure 4B:
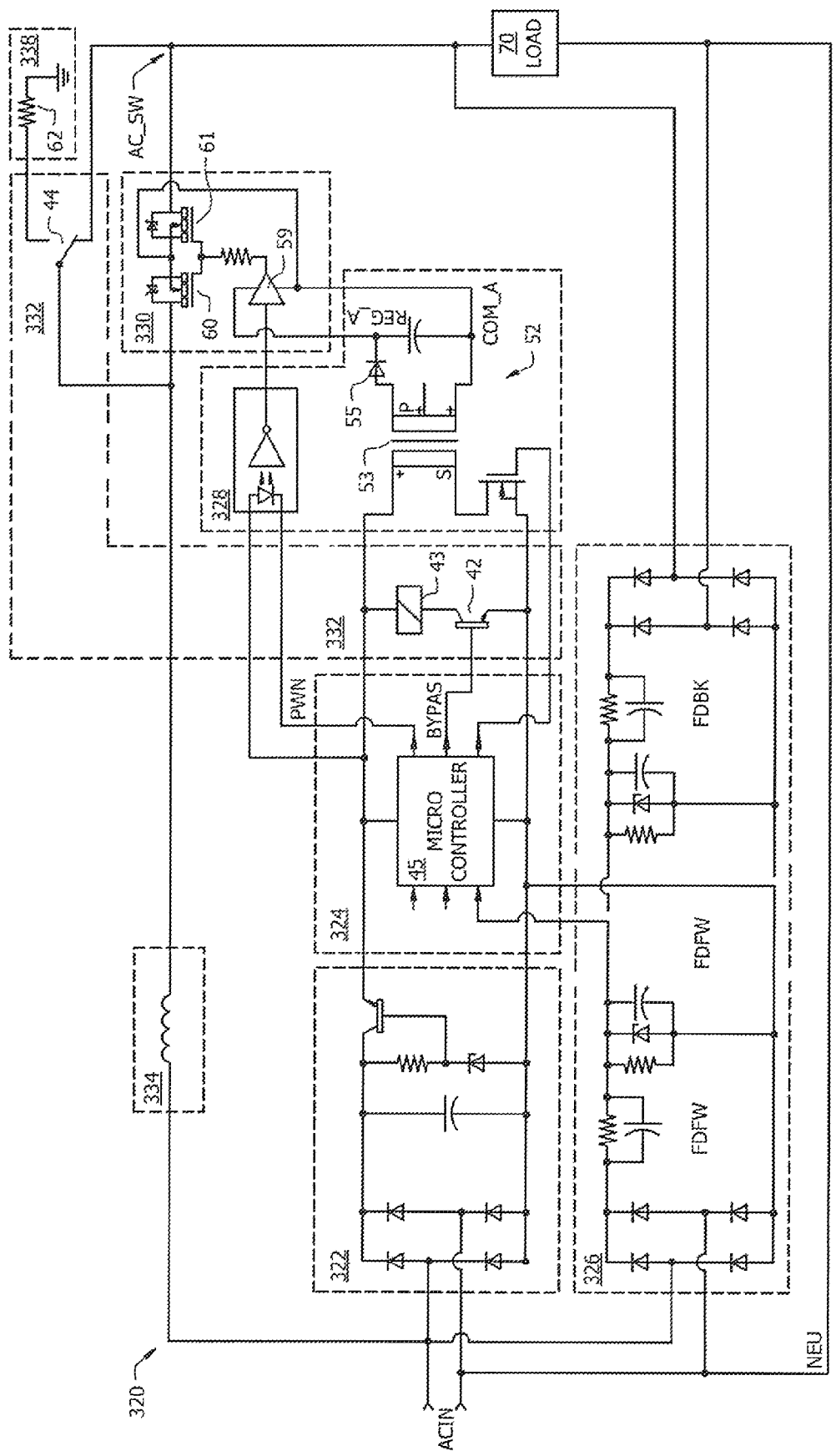
FIG. 4B is a circuit diagram of an exemplary embodiment of the circuit shown in FIG. 4A.

Referring now to FIG. 4B, a detailed block diagram of a circuit implementing circuit 220 of FIG. 4A, is presented. In this embodiment, bidirectional switching stage 330 is implemented with transistors 60 and 61 selected as N-channel enhancement MOSFET devices, allowing a reduced cost implementation due to the significant availability of enhancement mode devices. Additionally, there is a much wider selection of enhancement devices with a significant range of voltage and current performance specifications, thereby allowing the circuit, 320, to be easily scaled for higher or lower power operation. Driving the enhancement mode devices is also somewhat easier as only a positive turn-on gate voltage is required. Therefore, the common source terminals of transistors 60 and 61 can be connected to the floating ground reference signal COM_A, which is also the reference potential for gate driver 59. The single supply approach to driving transistors 60 and 61 also eliminates the need for a negative potential from isolation stage 328, switching regulator, 52.

The switched bypass stage 332 of circuit 320, is implemented in accordance with the second preferred embodiment, wherein a simple electromechanical relay, 43 and 44, is used to bypass the bidirectional switching stage 330. Control of the relay actuator, 44, is accomplished by energizing the relay coil 43, via transistor 42, which is turned on or off by the system control stage 324, microcontroller, 45. Relay actuator 44 is selected as a normally closed device; therefore, energizing the relay coil 43, opens the actuator contact and breaks the bypass signal path. This architecture allows microcontroller 45 to monitor the voltage signal, VMON, and decide when to open relay actuator 44 and begin modulating the pulse width modulated signal PWM. Typically, microcontroller 45 will open the relay actuator 44 when enough AC voltage is present to ensure adequate gate drive of transistors 60 and 61. This threshold is normally much lower than the protection thresholds where attenuation is required.

Some elements of the isolation stage 328 of circuit 320 can be implemented differently than the embodiment of FIG. 3A due to the eliminated requirement for a negative voltage potential. Isolated switching regulator 52 is constructed without utilizing a center tap on high-frequency transformer 53. Secondary rectification is reduced to only a single diode capacitor circuit 55, instead of two as used within the first preferred embodiment. However, it should be noted that the dual polarity, isolated switching regulator discussed in regards to the first preferred embodiment would function equally well within circuit 320. Simplifying isolated switching regulator 52 is illustrated to indicate cost saving potential and reduction in board real-estate when using enhancement mode transistors 60 and 61.

An optional load balancing stage 338 can be included to provide an impedance in parallel with the primary AC load 70. When incorporated, resistor 62 is connected to the normally open terminal of relay actuator 44 and the AC return signal, NEU.

Figure 10B:
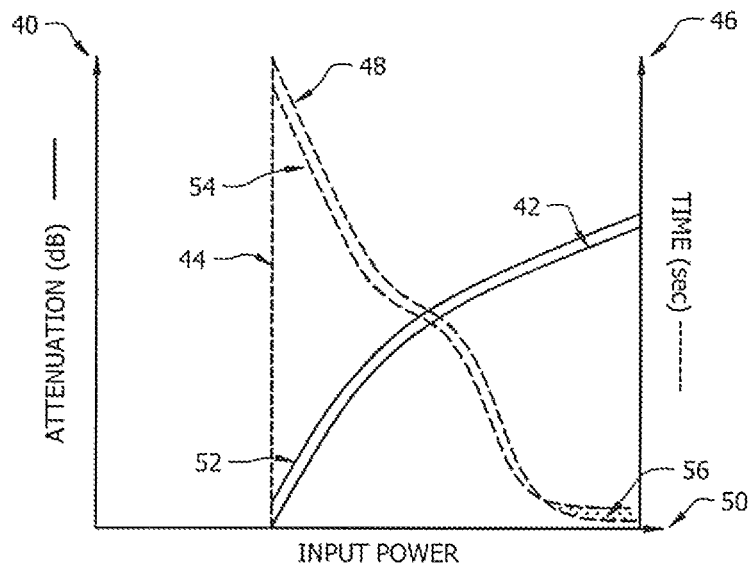
FIG. 10B is a plot of typical loudspeaker power handling characteristics overlaid with the an illustration of the exemplary operation of the embodiment of the circuit shown in FIG. 4A.

The resulting characteristics of embodiments according to the concepts described in FIGS. 4A and 4B are illustrated in FIG. 10B. Note that the amplitude characteristics, line 52, of the second preferred embodiment can be tailored to match the AC load requirements with a high degree of accuracy. Similarly, the time duration characteristics, line 54, of the second preferred embodiment can be programmed to match the sensitive AC load timing requirements; however, the use of an electromechanical relay does limit the maximum actuation speed. The net result is uninterrupted operation over a majority of the load power handling specification while ensuring the load is typically within the safe operating region, i.e. minimized damage regions.

Comparing the first preferred embodiment amplitude and timing characteristics, FIG. 10A, to the second preferred embodiment characteristics, FIG. 10B, one will see that the second embodiment achieves the same results as the first embodiment without providing ultra high speed (less than 1 millisecond) attack timing. However; the second embodiment allows a lower cost solution with easier scalability, and in cases where the load does not require ultra high speed, the second embodiment would be preferred. If damage region 56 is to be avoided while utilizing the concepts described in FIGS. 4A and 4B, one must incorporate a transistorized bypass stage typically constructed with depletion devices as previously described in FIG. 3B. The embodiment of using a solid-state, transistorized bypass stage in FIGS. 4A and 4B would broadly consist of a combination of the first and second preferred embodiments as previously described.

Figure 5A:
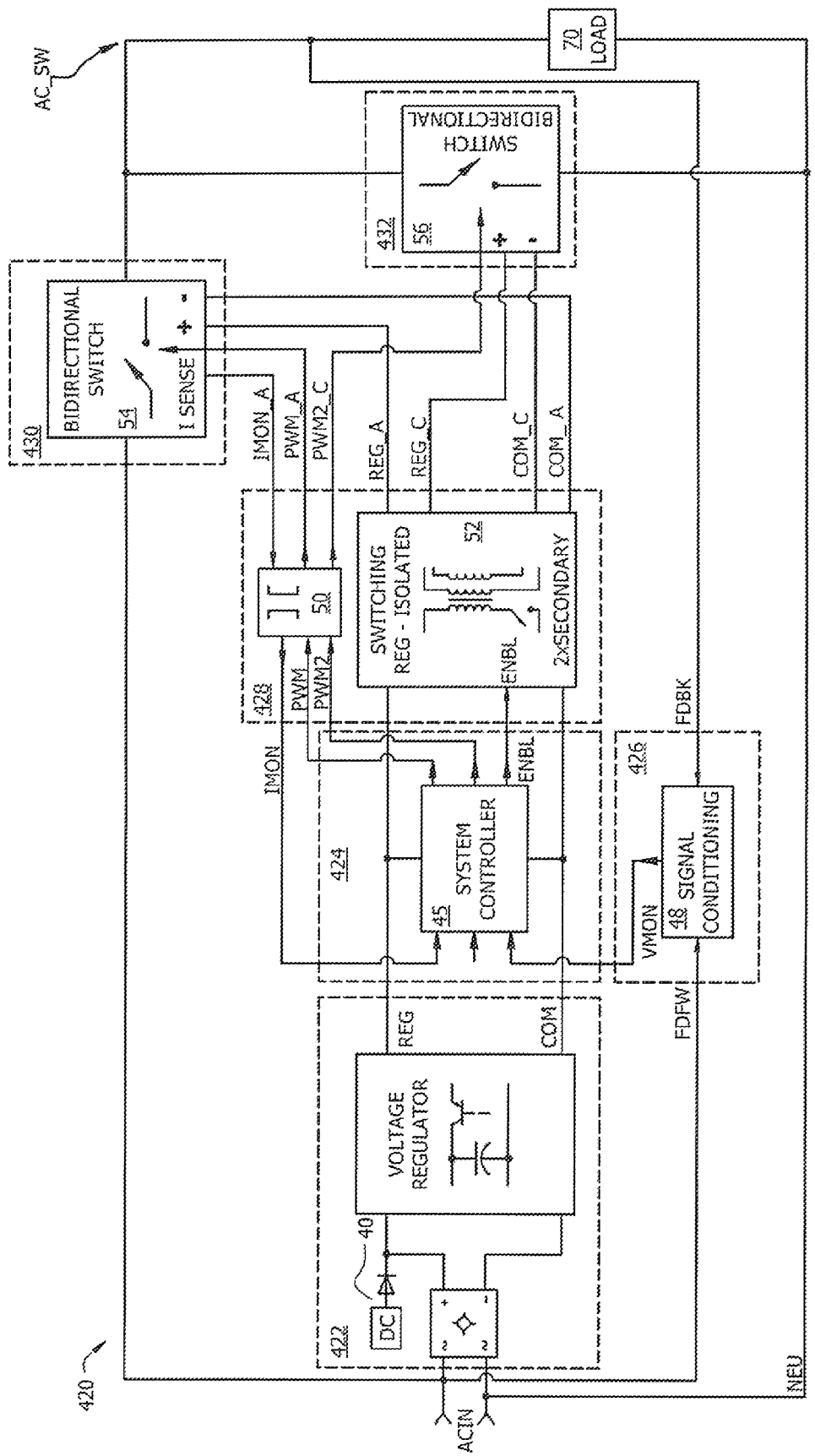
FIG. 5A is a block diagram of an alternate embodiment of a circuit according to the concepts described herein.

Referring now to FIG. 5A, a simplified block diagram of a alternate embodiment of a protection and/or attenuation circuit is described. Circuit 420 broadly comprises the same stages as discussed in regards to the embodiment described with respect to FIGS. 3A and 3B, however, circuit 420 includes a bidirectional shunt switching, stage 432, operable to provide a freewheeling current path for the AC load 70, during the cycle when bidirectional switch 54 is non-conductive, or open. This can be desirable when the AC load 70 is an inductive load such as a loudspeaker or electric motor. Though not limited thereto, the configuration of bidirectional shunt switching stage 432 is typically connected at the output of the series bidirectional switch 54, thereby forming a standard half-bridge, bidirectional switching output. Incorporation of bidirectional shunt switching stages, such as bidirectional shunt switching stage 432, requires the derivation of two pulse width modulated signals, PWM and PWM2, as well as their floating equivalents PWM_A and PWM2_A. These signals are derived with a nominal dead-time, wherein both signals are off, thereby eliminating cross-conduction between series bidirectional switch 54 and shunting bidirectional switch 56. Said dead-time is typically derived from within the system control stage 424 via firmware programming or digital delay logic.

Figure 5B:
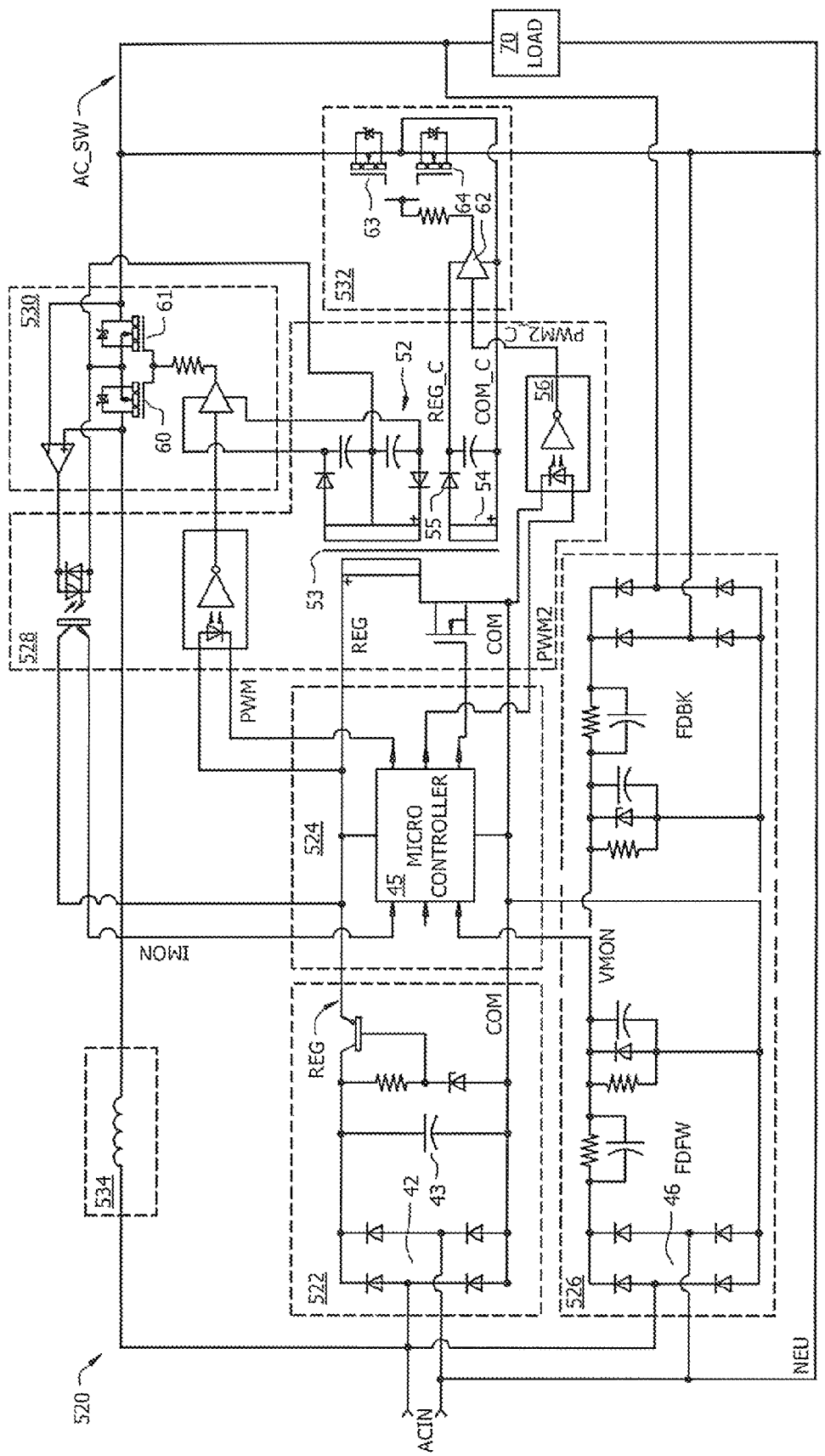
FIG. 5B is a circuit diagram of an exemplary embodiment of the circuit shown in FIG. 5A.

Referring now to FIG. 5B, an embodiment of a detailed circuit implementing the embodiment described with respect to FIG. 5A is described. Bidirectional shunt switching stage 532 is operable to provide a freewheeling current path for the AC load 70 during the cycle when series bidirectional transistor pair 60 and 61 are non-conductive, or open. Similar to the series bidirectional switching stage 530 the shunting bidirectional switch is constructed using two FET devices 63 and 64 with their respective source terminals connected together. Drain terminal of transistor 63 is connected to the drain of the series bidirectional switch transistor 61, while drain terminal of transistor 64 is connected to the AC return path, NEU. Though not limited to, if provision of a freewheeling current path is desirable for the AC input drive signal ACIN, drain terminal of transistor 63 could be connected to the drain of transistor 60 the input of the series bidirectional switching stage 530. Additionally, two shunting bidirectional switches could be employed with first said shunting bidirectional switch connected between the AC input ACIN, and AC return NEU; the second shunting bidirectional switch connected between the switched AC output, AC_SW, and AC return NEU, thereby creating a pi attenuator. This embodiment is shown using depletion PET devices 60 and 61 for the series bidirectional switch, and using enhancement PET devices 63 and 64 for the shunting bidirectional switch. Enhancement devices require only a single positive voltage potential for turn-on, thereby resulting in a simpler gate drive circuit 62.

Isolation stage 528 is operable to provide the necessary floating voltage potentials to power bother the series bidirectional switching stage 530 and the bidirectional shunt switching stage 532. By incorporating an additional secondary winding 54 to high-frequency transformer 53, the isolated switching regulator 52 is capable of supplying floating voltage potentials REG_C and COM_C to the bidirectional shunt switching stage 532. Due to the utilization of enhancement FET devices for transistors 63 and 64, the new winding 54 on high-frequency transformer 52 only requires a single diode 55 for secondary rectification. Similarly, if a second shunting bidirectional switch was desirable to create a pi attenuator, a fourth winding and secondary rectifier could be added to switching regulator 52. In additional to incorporating new voltage outputs REG_C and COM_C, the isolation stage 528 in the third preferred embodiment includes an additional digital isolator 56 allowing the common ground COM referenced second pulse width modulated signal PWM2 to be electrically isolated from the bidirectional shunt switching stage 532, and thereby derives a floating pulse width modulated signal PWM2_C.

System control stage 524 is operable to provide a second pulse width modulated signal PWM2 useful for control of the bidirectional shunting transistors 63 and 64. Similar to the derivation of said first pulse width modulated signal PWM, the system controller derives the second said pulse width modulated signal PWM2 via algorithms monitoring the voltage and/or current signals VMON and/or IMON. Dead-time derivation is employed within the system control stage 524 to allow a programmable amount of time, wherein both said pulse width modulated signals PWM and PWM2 are driven in an active low state, thereby ensuring both series and shunting bidirectional switching stages 530 and 532 are non-conductive. This is desirable to eliminate cross-conduction scenarios between the two bidirectional switch transistor pairs 60/61 and 63/64. Obvious to one skilled in the art, derivation of the dead-time can be accomplished through a variety of techniques including, but not limited to, digital logic gates, programmable logic, microcontroller, or industry standard integrated circuits.

Figure 5C:
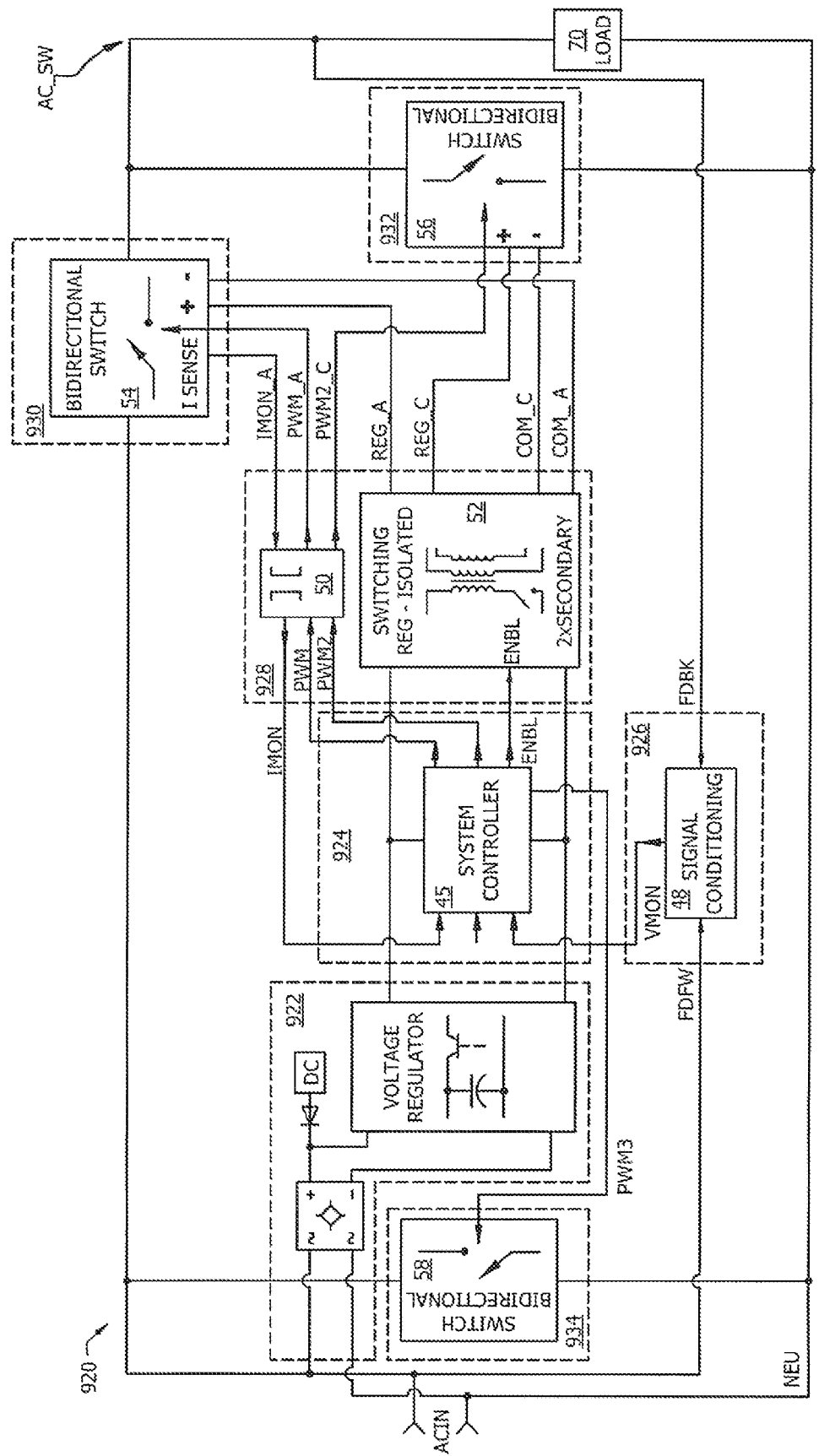
FIG. 5C is a circuit diagram of an alternate embodiment of the circuit shown in FIG. 5A.

Referring now to FIG. 5C, a simplified block diagram of a alternate embodiment of the protection and/or attenuation circuit shown in FIG. 5A is described. Circuit 920 broadly comprises the same stages as discussed in regards to the embodiment described with respect to FIG. 5A; however, circuit 920 includes a bidirectional shunt switching stage 934, operable to provide a freewheeling current path for the AC input signal ACIN, during the cycle when bidirectional switch 54 is non-conductive, or open. In this configuration, the shunting switch 58 provides a freewheeling current path for the external circuitry driving the AC input signal ACIN. This can be desirable when the AC input ACIN, is driven from an inductive capacitive circuit common to many passive loudspeaker systems. Though not limited thereto, it should be obvious to those skilled in the art that it is possible to incorporate two distinct bidirectional shunt switching stages 934 and 932 forming a pi attenuator. A first bidirectional shunting switch 58 would be connected between the input of series bidirectional switch 54 and the AC return NEU, while the second bidirectional shunting switch 56, would be connected as shown in circuit 920, between the output of series bidirectional switch 54 and the AC return NEU. Incorporation of bidirectional shunt switching stage 934, requires the derivation of two pulse width modulated signals, PWM and PWM3, which are generally derived within the system control stage via firmware programming or logical derivation. Though not limited thereto, these signals can be derived with a nominal dead-time, wherein both signals are off, thereby eliminating conditions wherein series bidirectional switch 54 and shunting bidirectional switch 58 are both conductive.

Referring now to FIG. 6A, a simplified block diagram of an alternate embodiment of a protection and/or attenuation circuit is described. Circuit 620 broadly comprises the same stages as discussed in regards to the embodiment described in FIGS. 3A, 4A and 5A, however, circuit 620 employs a significant change to the isolation stages discussed within the previous embodiments. More specifically, circuit 620 employs an isolation stage 628 that eliminates the requirement for digital isolation devices, such as the optical isolators common to the previous embodiments. To accomplish the removal of digital isolation devices, the fourth preferred embodiment 620 makes use of system control stage 624 enable signal ENBL to gate the switching regulator 52 with pulse width modulation, thereby modulating the switching regulator with the pulse width modulated signals common to the aforementioned preferred embodiments.

Isolation stage, 628, is configured to receive the power supply signals REG and COM as well as the system control enable signal ENBL and derive therefrom, isolated voltage potentials REG_A and COM_A, and a pulse width modulated signal PWM_A. Isolation stage 628 incorporates envelope detector 44 operable to demodulate the amplitude modulation present on output of the switching regulator 52 there by deriving the envelope output signal ENV. Subsequent to envelope detection, a simple two-state logic gate 46 is used to derive the final recovered pulse width modulated signal PWM_A for transmission to the bidirectional switching stage 630.

System control stage 624 is operable to derive a pulse width modulated enable signal ENBL for transmission to the isolation stage 628. Derivation of the pulse width modulated enable signal ENBL is identical to the techniques employed in aforementioned embodiments. The effect of pulse width modulating the enable signal ENBL results in an amplitude modulated switching waveform at the output of switching regulator 52 wherein the pulse width modulation can be recovered by envelope detector 44 and logic gate 46.

Referring now to FIG. 6B, an embodiment of a detailed circuit implementing the circuit of FIG. 6A is described. Circuit 720 includes isolation stage, 728 and is operable to provide the capability for gating switching regulator, 52, and provides the circuitry to recover the pulse width modulated signal, PWM_A, from the amplitude modulated switching regulator output. Gating the switching regulator is accomplished by allowing the system controller to derive a high-frequency signal that can drive the gate of transistor 54. By applying a high frequency gate signal to transistor 54, the desired isolated switching regulator will energize the primary of transformer 53 allowing energy transmission through the high-frequency magnetic core of transformer 53. Subsequently, if microcontroller 45 pulse amplitude modulates, or gates, the high-frequency signal ENBL driving the gate of transistor 54, the result is an amplitude modulated output on the secondary of transformer 53 that can be demodulated to recovered the amplitude envelope using envelope detector 44.

Figure 9:
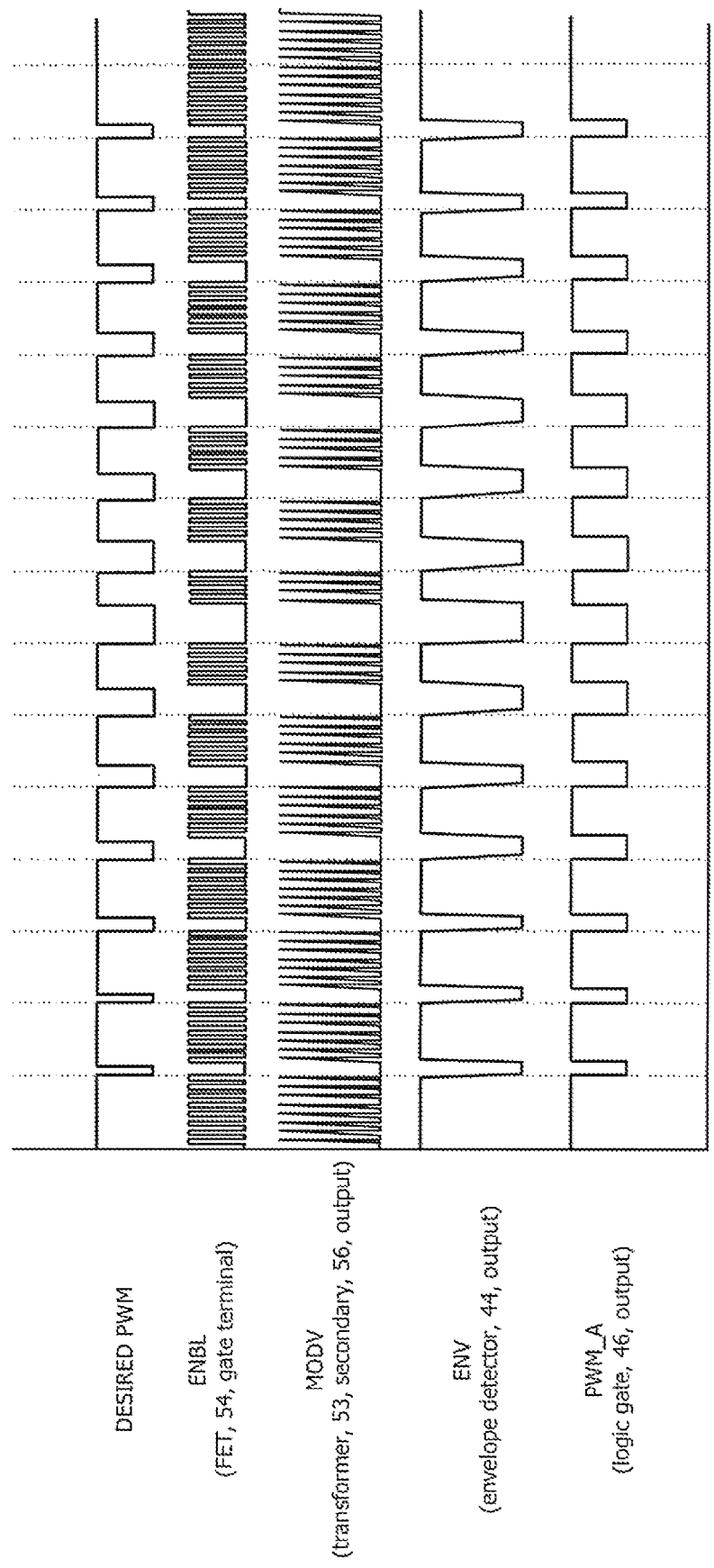
FIG. 9 is a timing diagram illustrating the modulation used in the embodiment of the circuit shown in FIG. 6A.

Envelope detector 44, contained within the isolation stage 728, is operable to recover the pulse amplitude modulated waveform from the output of transformer 53 and provide a digital logic-level output PWM_A proportional to the pulse width modulated enable signal ENBL derived by the system controller 45. Referring to the timing diagram in FIG. 9, the desired pulse width modulation signal PWM is overlaid with the required high-frequency stimulus needed for driving the gate GATE of transistor 54 with the resulting pulse amplitude modulated output ENBL. FIG. 9 also illustrates the secondary voltage waveform MODV as seen on transformer 53, secondary 56, as well as the envelope recovery signals ENV and PWM_A.

It will be appreciated by those with ordinary skill in the electrical arts that the system control stages in the aforementioned preferred embodiments could be implemented with a variety of digital or power management devices. For example, one could use a programmable logic device, microcontroller, application specific integrated circuit, a standard pulse width modulation control integrated circuit common to power management systems, or a discrete pulse width modulation circuit. The preferred embodiments benefit from utilizing programmable devices, thereby allowing programmable protection thresholds, timing, and monitoring; however, a fixed architecture pulse width modulation circuit, such as a triangle or saw tooth intercept based topology, could be employed to monitor VMON and or IMON and create the desired pulse width modulated signal, PWM.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A circuit for analog loads receiving a signal, the circuit comprising;
    a system controller monitoring at least one characteristic of the signal, wherein the system controller generates a pulse width modulated signal based on the at least one characteristic of the signal;
    a switching stage connected to the signal and controlled by the system controller, wherein the switching stage is operable to attenuate the signal using the pulse width modulated signal from the system controller; and
    an isolation stage connected between the system controller and the switching stage, the isolation stage providing electrical isolation between the system controller and the switching stage, thereby allowing the switching stage to electrically float with respect to a common ground reference of the system controller.

2. The circuit of claim 1 further comprising a power supply stage connected to the signal and the system controller, the power supply stage operable to generate a regulated DC output voltage from the signal, wherein the power required by the protection circuit is drawn from signal.

3. The circuit of claim 1 further comprising a signal conditioning stage connected to an input signal to the circuit and generating a feed forward voltage monitoring signal indicative of the input voltage of the input signal, and wherein the at least one characteristic of the signal comprises the feed forward voltage monitoring signal.

4. The circuit of claim 1 further comprising a signal conditioning stage connected to the output of the circuit and generating a feedback voltage monitoring signal indicative of the output voltage of the of the circuit, wherein the at least one characteristic of the signal comprises the feedback voltage monitoring signal.

5. The circuit of claim 1 wherein the at least one characteristic of the signal comprises a current monitoring signal.

6. The circuit of claim 1 wherein the at least one characteristic of the input signal comprises a current monitoring signal, the current monitoring signal generated by the isolation stage.

7. The circuit of claim 1 wherein the at least one characteristic of the input signal comprises both a voltage monitoring signal and a current monitoring signal, thereby allowing the system controller to monitor the power delivered to the load.

8. The circuit of claim 1 wherein the at least one characteristic of the input signal comprises both a voltage monitoring signal and a current monitoring signal, thereby allowing the system controller to derive the impedance of the load.

9. The circuit of claim 1 wherein the switching stage includes a bidirectional switch.

10. The circuit of claim 1 further comprising a switched bypass stage controlled by the system controller and operable to provide a signal path around the switching stage.

11. The circuit of claim 1 further comprising a bidirectional shunt switching stage operable to provide a freewheeling current path for the load.

12. The circuit of claim 1 further comprising a bidirectional shunt switching stage operable to provide a freewheeling current path for the source.

13. The circuit of claim 1 wherein the isolation stage is operable to gate the input of an isolated switching voltage regulator, the gate being derived from the pulse width modulated signal.

14. The circuit of claim 13 wherein the isolation stage is operable to recover the pulse width modulated signal at the output of an isolated switching voltage regulator.

15. A method for protecting a load from an analog signal with a protection circuit, the method comprising:
monitoring at least one characteristic of the analog signal;
generating a pulse width modulated signal based on the at least one characteristic of the analog signal;
applying the pulse width modulated signal to the analog signal using a switching stage when one or more of the monitored characteristics of the analog signal exceed a predetermined threshold, such that the analog signal is attenuated by the pulse width modulated signal; and
providing electrical isolation of the switching stage, thereby allowing the switching stage to electrically float with respect to a common ground reference.

16. The method of claim 15 wherein the at least one characteristic of the analog signal comprises a feedback voltage monitoring signal.

17. The method of claim 15 wherein the at least one characteristic of the analog signal comprises a feed forward voltage monitoring signal.

18. The method of claim 15 wherein the at least one characteristic of the input signal comprises a current monitoring signal.

19. The method of claim 15 wherein the at least one characteristic of the input signal comprises both a voltage monitoring signal and a current monitoring signal.

20. The method of claim 15 further comprising generating a regulated DC output voltage from the analog signal, wherein the power required for the protection circuit is drawn from analog signal.

21. The method of claim 15 wherein the load is a loudspeaker.

22. A protection circuit for AC loads comprising:
an AC load receiving an analog signal having a voltage and a current;
a system controller monitoring the voltage and the current of the analog signal, wherein the system controller generates a pulse width modulated signal based on the voltage and current of the analog signal and a protection threshold for the AC load;
a bidirectional switching stage connected to the analog signal and controlled by the system controller, wherein the bidirectional switching stage is operable to attenuate the analog signal using the pulse width modulated signal from the system controller when the analog signal exceeds the protection threshold;
an isolation stage connected between the system controller and the bidirectional switching stage, the isolation stage providing electrical isolation between the system controller and the switching stage, thereby allowing the bidirectional switching stage to electrically float with respect to a common ground reference of the system controller; and
a power supply stage connected to the analog signal, the power supply stage operable to generate a regulated DC output voltage from the analog signal, wherein all the power required by the protection circuit is drawn from analog signal.

23. The protection circuit of claim 22 further comprising a signal conditioning stage connected to the analog signal and generates a signal indicative of the voltage of the analog signal.

24. The protection circuit of claim 22 wherein a current monitoring signal indicative of the input current is generated by the isolation stage.

25. The protection circuit of claim 22 further comprising a switched bypass stage controlled by the system controller and operable to provide a signal path around the bidirectional switching stage.

26. The protection circuit of claim 22 further comprising a bidirectional shunt switching stage operable to provide a freewheeling current path for the AC load.

27. The protection circuit of claim 22 further comprising a bidirectional shunt switching stage operable to provide a freewheeling current path for the AC source.

* * * * *